United States Patent
Chang et al.

(10) Patent No.: US 10,510,894 B2
(45) Date of Patent: Dec. 17, 2019

(54) ISOLATION STRUCTURE HAVING DIFFERENT DISTANCES TO ADJACENT FINFET DEVICES

(71) Applicant: Taiwan Semiconductor Manufacturing Co., Ltd., Hsin-Chu (TW)

(72) Inventors: Chang-Yun Chang, Taipei (TW); Ming-Ching Chang, Hsinchu (TW); Shu-Yuan Ku, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/941,137

(22) Filed: Mar. 30, 2018

(65) Prior Publication Data

US 2019/0165155 A1   May 30, 2019

Related U.S. Application Data

(60) Provisional application No. 62/592,510, filed on Nov. 30, 2017.

(51) Int. Cl.
*H01L 29/78* (2006.01)
*H01L 21/762* (2006.01)
(Continued)

(52) U.S. Cl.
CPC ...... *H01L 29/785* (2013.01); *H01L 21/30604* (2013.01); *H01L 21/76229* (2013.01); *H01L 21/823431* (2013.01); *H01L 21/823481* (2013.01); *H01L 21/823821* (2013.01); *H01L 21/823878* (2013.01); *H01L 27/0924* (2013.01);
(Continued)

(58) Field of Classification Search
CPC ............. H01L 29/785; H01L 21/30604; H01L 21/76229; H01L 21/823431; H01L 21/823484; H01L 21/823821; H01L 21/823878; H01L 27/0924; H01L 29/0649; H01L 29/66795
See application file for complete search history.

(56) References Cited

U.S. PATENT DOCUMENTS 6,660,596 B2 * 12/2003 Adkisson .......... H01L 21/76264
257/E21.444
7,425,740 B2   9/2008 Liu et al.
(Continued)

*Primary Examiner* — Earl N Taylor
(74) *Attorney, Agent, or Firm* — Haynes and Boone, LLP

(57) ABSTRACT

A first FinFET device includes first fin structures that extend in a first direction in a top view. A second FinFET device includes second fin structures that extend in the first direction in the top view. The first FinFET device and the second FinFET device are different types of FinFET devices. A plurality of gate structures extend in a second direction in the top view. The second direction is different from the first direction. Each of the gate structures partially wraps around the first fin structures and the second fin structures. A dielectric structure is disposed between the first FinFET device and the second FinFET device. The dielectric structure cuts each of the gate structures into a first segment for the first FinFET device and a second segment for the second FinFET device. The dielectric structure is located closer to the first FinFET device than to the second FinFET device.

20 Claims, 33 Drawing Sheets

(51) Int. Cl.
*H01L 21/8238* (2006.01)
*H01L 21/306* (2006.01)
*H01L 29/66* (2006.01)
*H01L 29/06* (2006.01)
*H01L 21/8234* (2006.01)
*H01L 27/092* (2006.01)

(52) U.S. Cl.
CPC .... *H01L 29/0649* (2013.01); *H01L 29/66795* (2013.01)

(56) References Cited

U.S. PATENT DOCUMENTS

| | | |
|---|---|---|
| 7,667,271 B2 | 2/2010 | Yu et al. |
| 7,825,482 B2 * | 11/2010 | Okazaki .......... H01L 21/823835 257/413 |
| 7,910,453 B2 | 3/2011 | Xu et al. |
| 8,048,723 B2 | 11/2011 | Chang et al. |
| 8,053,299 B2 | 11/2011 | Xu |
| 8,183,627 B2 | 5/2012 | Currie |
| 8,362,575 B2 | 1/2013 | Kwok et al. |
| 8,367,498 B2 | 2/2013 | Chang et al. |
| 8,377,779 B1 | 2/2013 | Wang |
| 8,399,931 B2 | 3/2013 | Liaw et al. |
| 8,415,718 B2 | 4/2013 | Xu |
| 8,440,517 B2 | 5/2013 | Lin et al. |
| 8,487,378 B2 | 7/2013 | Goto et al. |
| 8,497,177 B1 | 7/2013 | Chang et al. |
| 8,497,528 B2 | 7/2013 | Lee et al. |
| 8,609,518 B2 | 12/2013 | Wann et al. |
| 8,610,240 B2 | 12/2013 | Lee et al. |
| 8,618,556 B2 | 12/2013 | Wu et al. |
| 8,633,516 B1 | 1/2014 | Wu et al. |
| 8,652,894 B2 | 2/2014 | Lin et al. |
| 8,680,576 B2 | 3/2014 | Ching et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,741,722 B2 * | 6/2014 | Chang .............. H01L 29/66545 257/365 |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,796,759 B2 | 8/2014 | Perng et al. |
| 8,809,139 B2 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,826,213 B1 * | 9/2014 | Ho ..................... G06F 17/5036 716/110 |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,887,106 B2 | 11/2014 | Ho et al. |
| 9,105,490 B2 | 8/2015 | Wang et al. |
| 9,214,358 B1 * | 12/2015 | Lin ....................... H01L 29/66 |
| 9,219,153 B2 * | 12/2015 | Xie ..................... H01L 29/785 |
| 9,293,459 B1 * | 3/2016 | Cheng ............. H01L 27/0886 |
| 9,508,727 B2 * | 11/2016 | Park ............... H01L 21/823828 |
| 9,543,935 B2 * | 1/2017 | Ankenapalli ......... H03K 5/134 |
| 9,601,492 B1 * | 3/2017 | Deng ................ H01L 27/0924 |
| 9,601,567 B1 * | 3/2017 | Hsieh ................. H01L 29/785 |
| 9,711,503 B2 * | 7/2017 | Xie .................... H01L 29/4916 |
| 9,899,267 B1 * | 2/2018 | Liou ............... H01L 21/823878 |
| 9,917,085 B2 * | 3/2018 | Lin ................. H01L 21/823481 |
| 9,947,592 B2 * | 4/2018 | Deng ............. H01L 21/823821 |
| 10,043,807 B1 * | 8/2018 | Lee .................... H01L 27/0924 |
| 10,115,825 B1 * | 10/2018 | Liaw ................. H01L 29/7848 |
| 10,157,746 B2 * | 12/2018 | Hsieh ................. H01L 29/785 |
| 10,177,037 B2 * | 1/2019 | Zang ............... H01L 21/823437 |
| 2011/0068407 A1 | 3/2011 | Yeh et al. |
| 2013/0011983 A1 | 1/2013 | Tsai et al. |
| 2013/0285153 A1 | 10/2013 | Lee et al. |
| 2014/0001564 A1 * | 1/2014 | Song ................... G06F 17/5081 257/369 |
| 2014/0001574 A1 | 1/2014 | Chen et al. |
| 2014/0110755 A1 | 4/2014 | Colinge |
| 2014/0151812 A1 | 6/2014 | Liaw |
| 2014/0183600 A1 | 7/2014 | Huang et al. |
| 2014/0252412 A1 | 9/2014 | Tsai et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2015/0054078 A1 * | 2/2015 | Xie ..................... H01L 29/785 257/347 |
| 2015/0145041 A1 * | 5/2015 | Divakaruni ......... H01L 27/1211 257/347 |
| 2015/0171217 A1 * | 6/2015 | Kim .................. H01L 29/66795 257/401 |
| 2015/0263003 A1 | 9/2015 | Lee et al. |
| 2015/0270262 A1 * | 9/2015 | Xie ................... H01L 29/4916 257/401 |
| 2016/0079354 A1 * | 3/2016 | Park ................. H01L 27/0886 257/386 |
| 2016/0111536 A1 * | 4/2016 | Chen ................ H01L 29/7848 257/401 |
| 2016/0133632 A1 * | 5/2016 | Park ............... H01L 21/823828 257/369 |
| 2017/0345820 A1 * | 11/2017 | Lin ................. H01L 21/823481 |
| 2019/0096883 A1 * | 3/2019 | Chen ................ H01L 27/0886 |

* cited by examiner

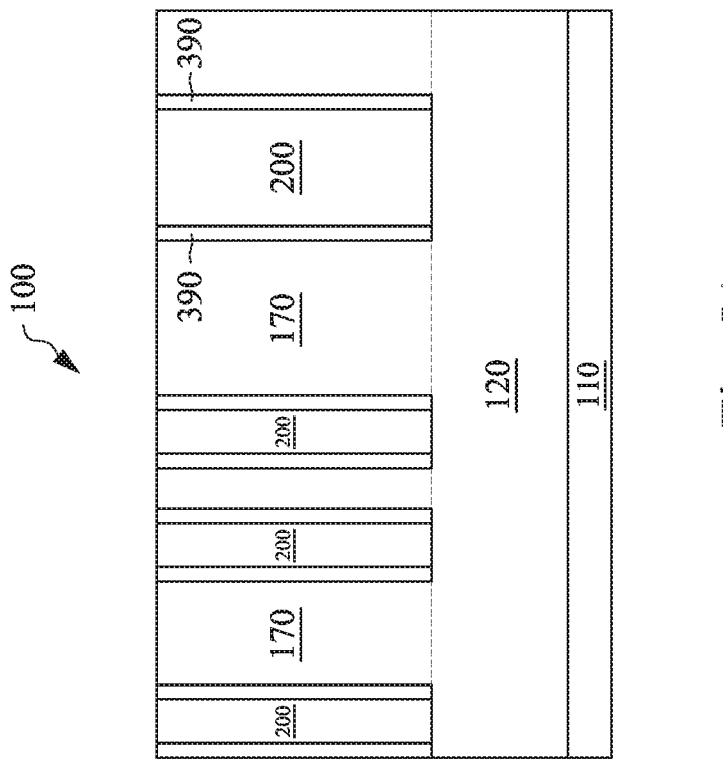

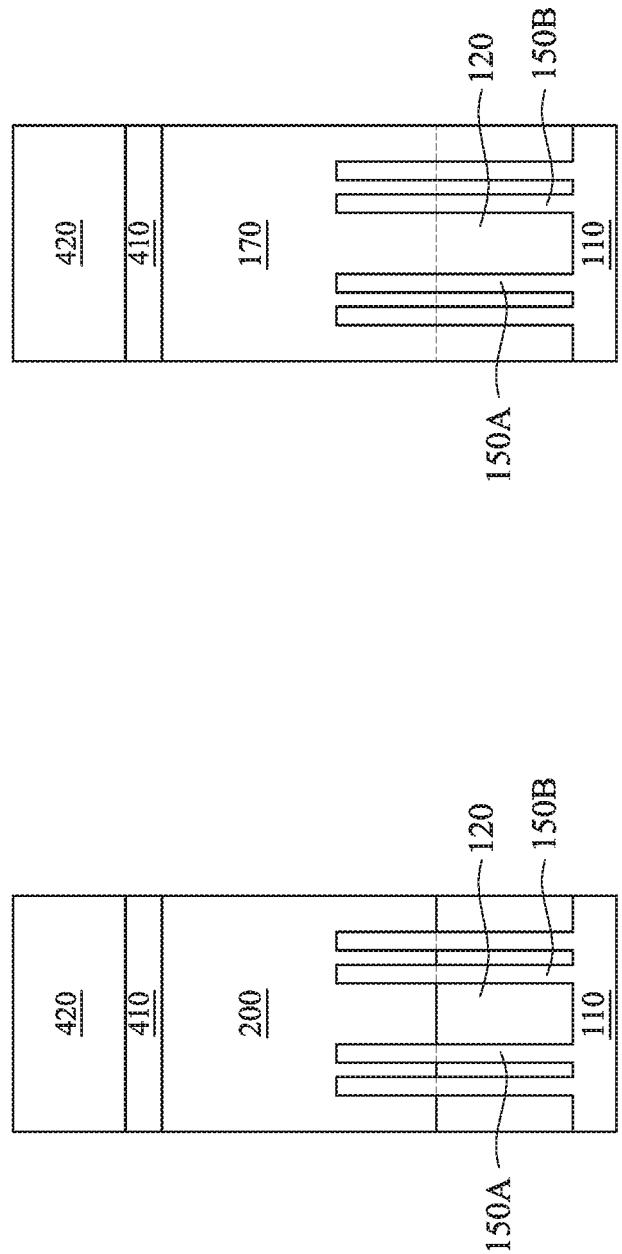

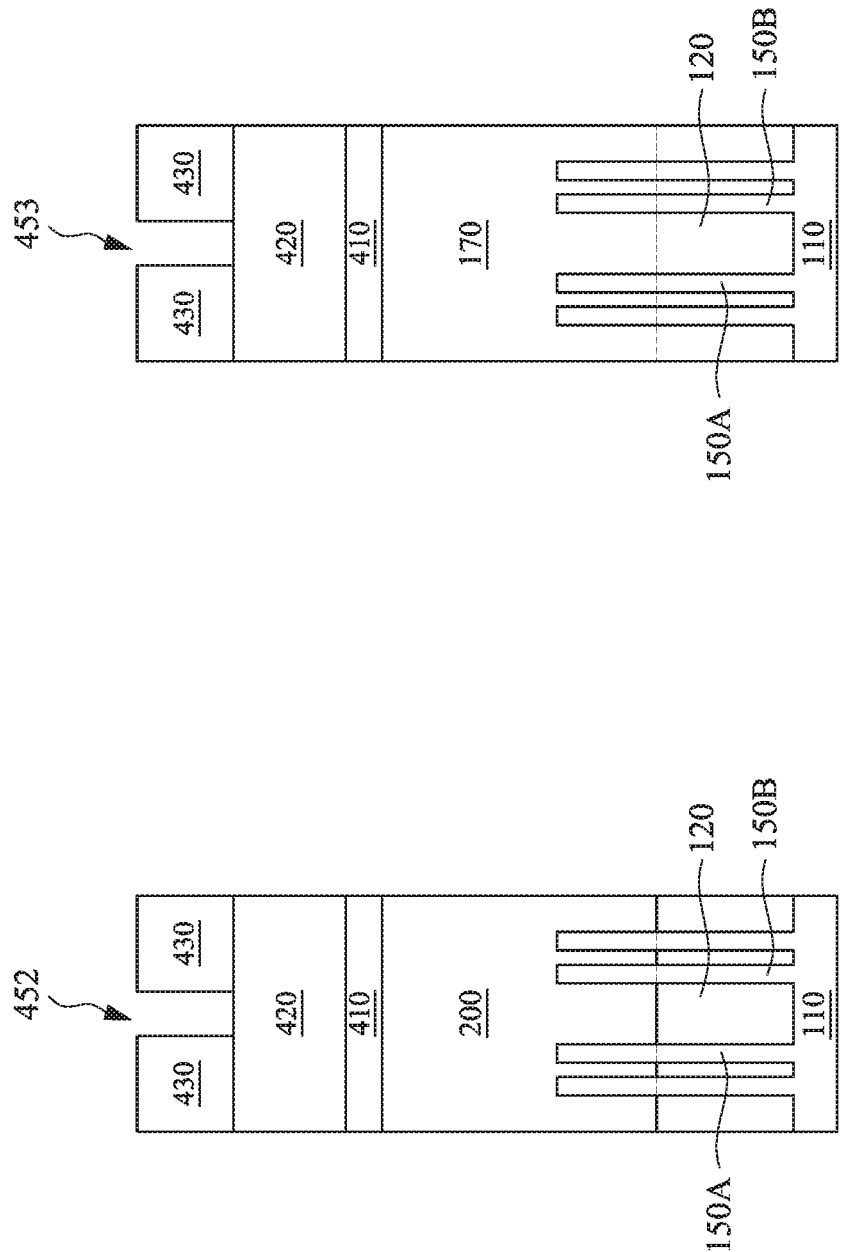

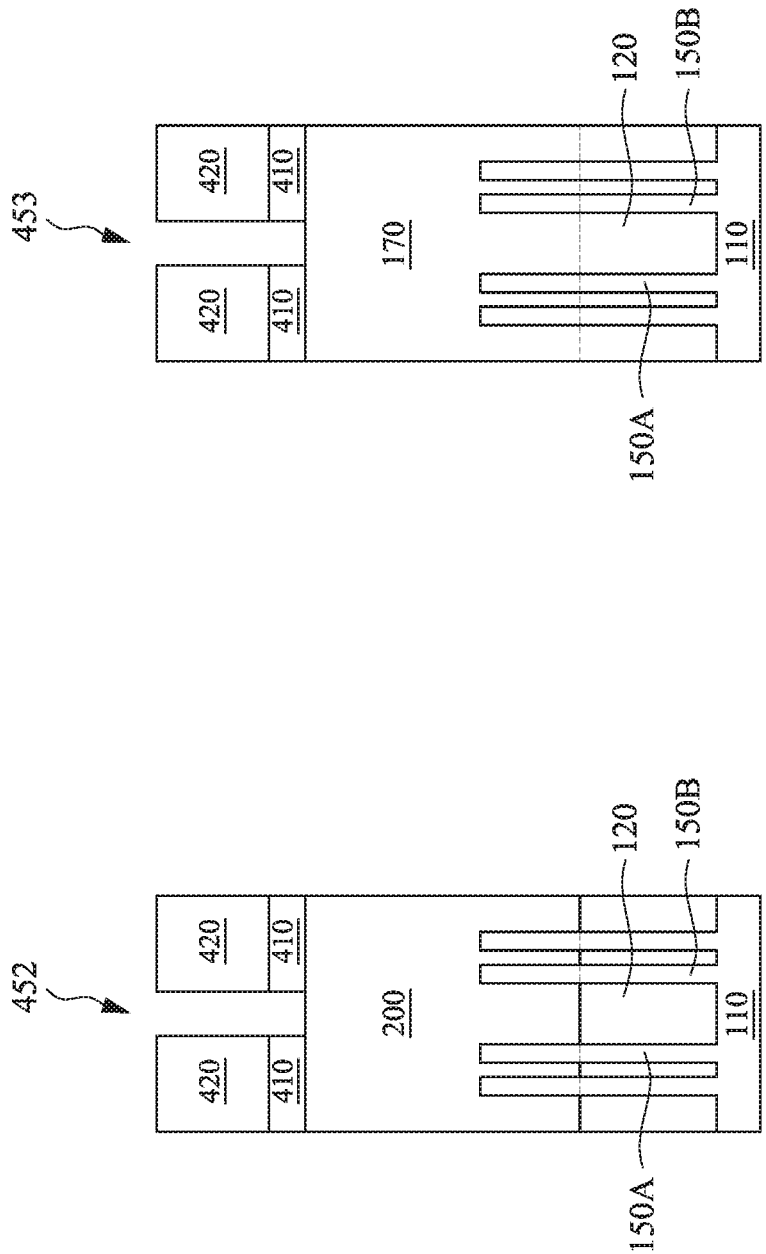

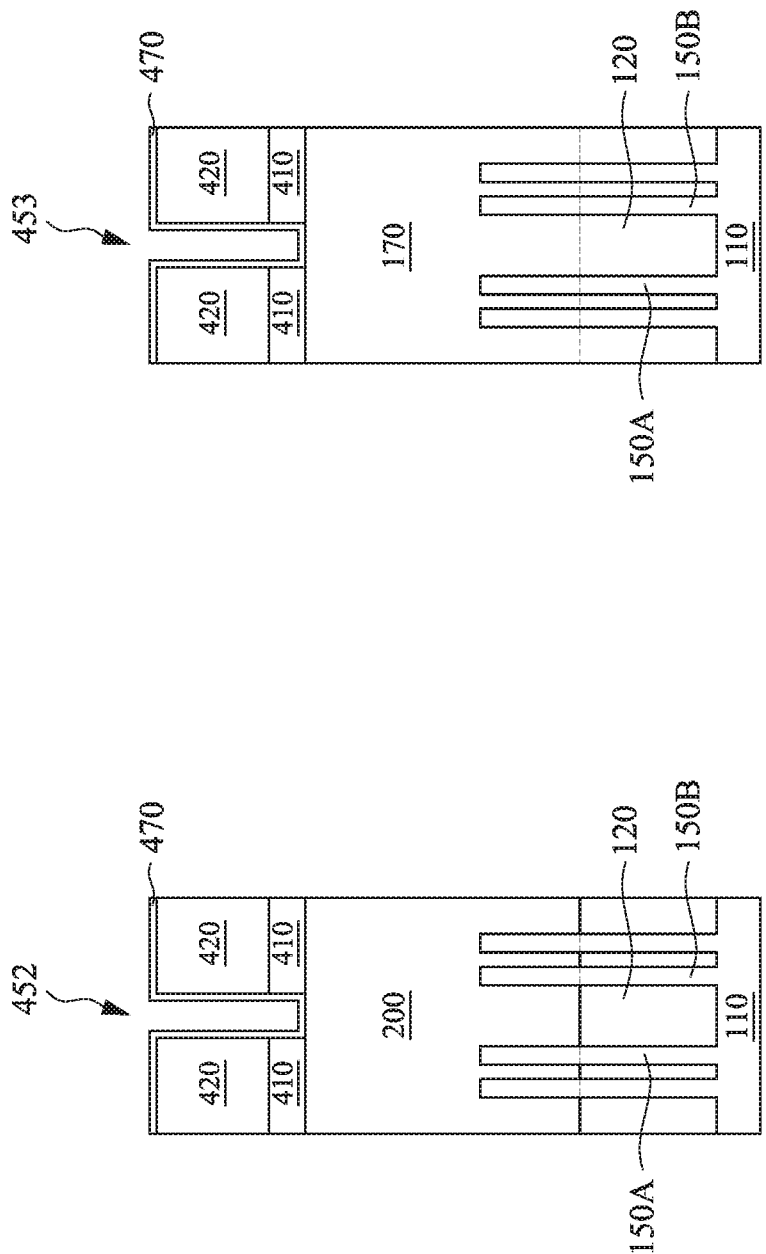

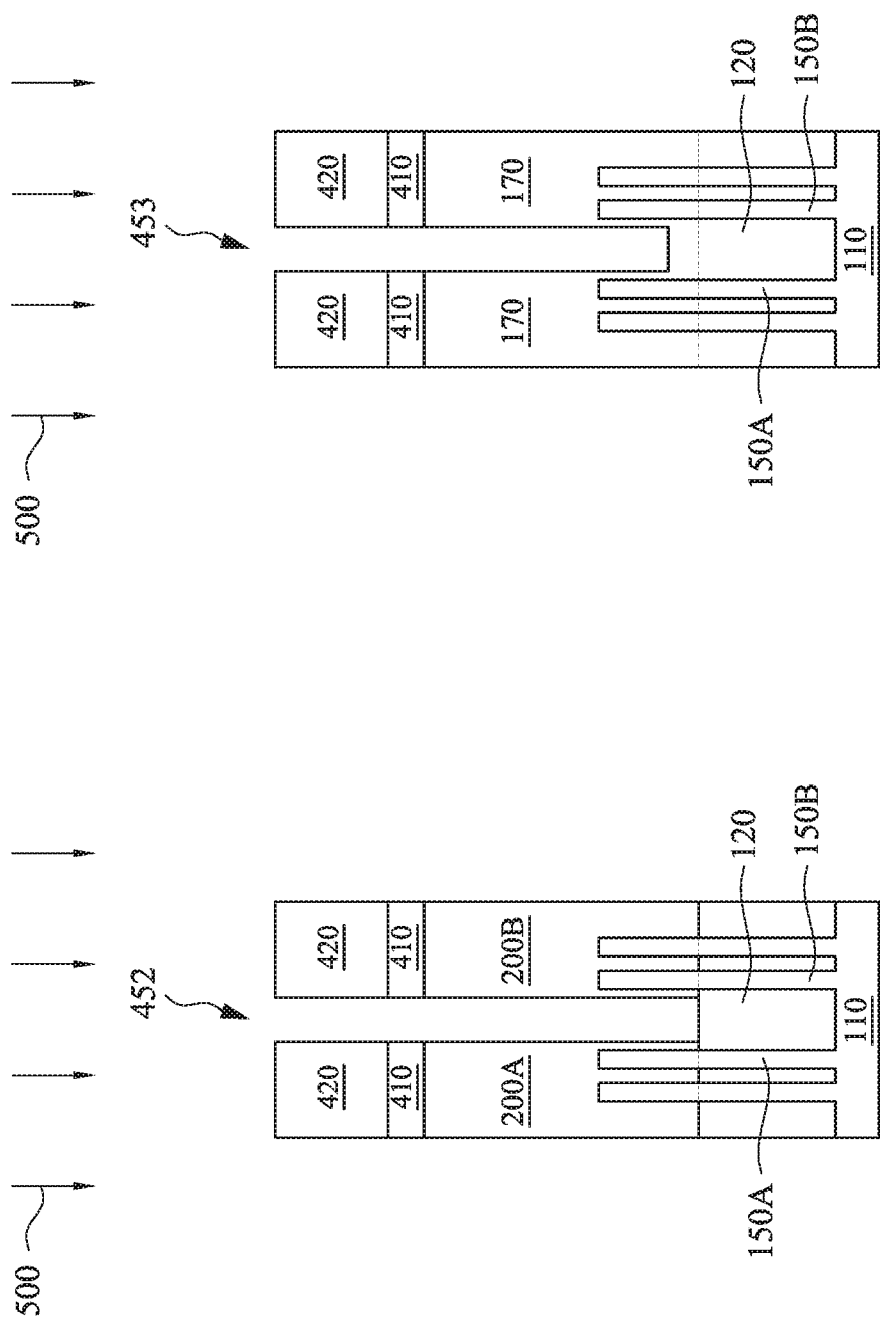

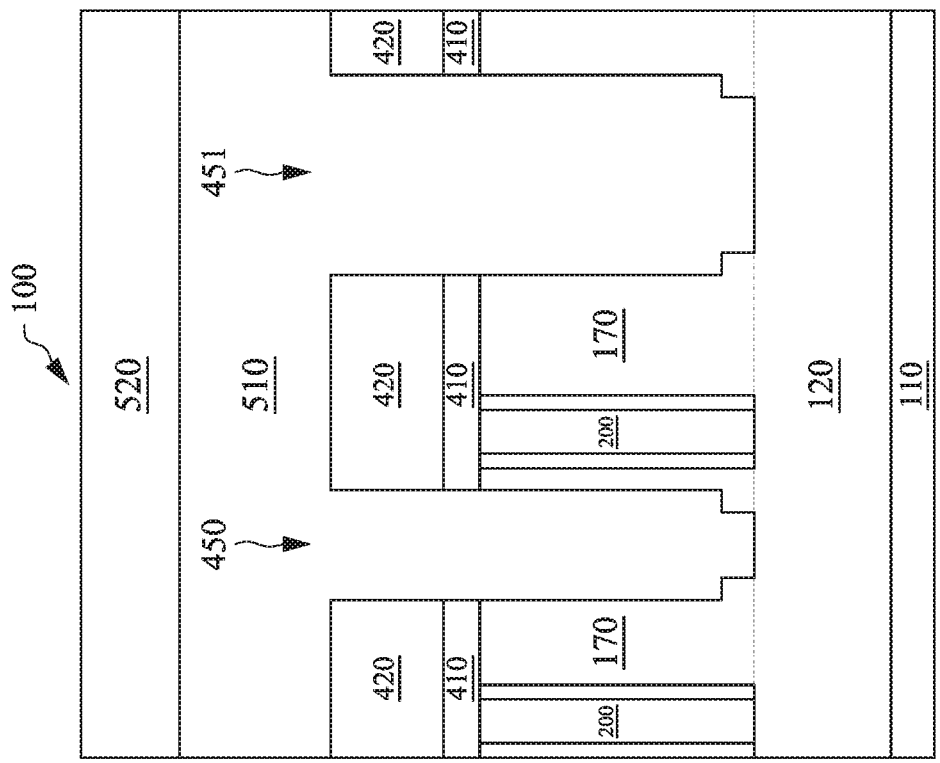

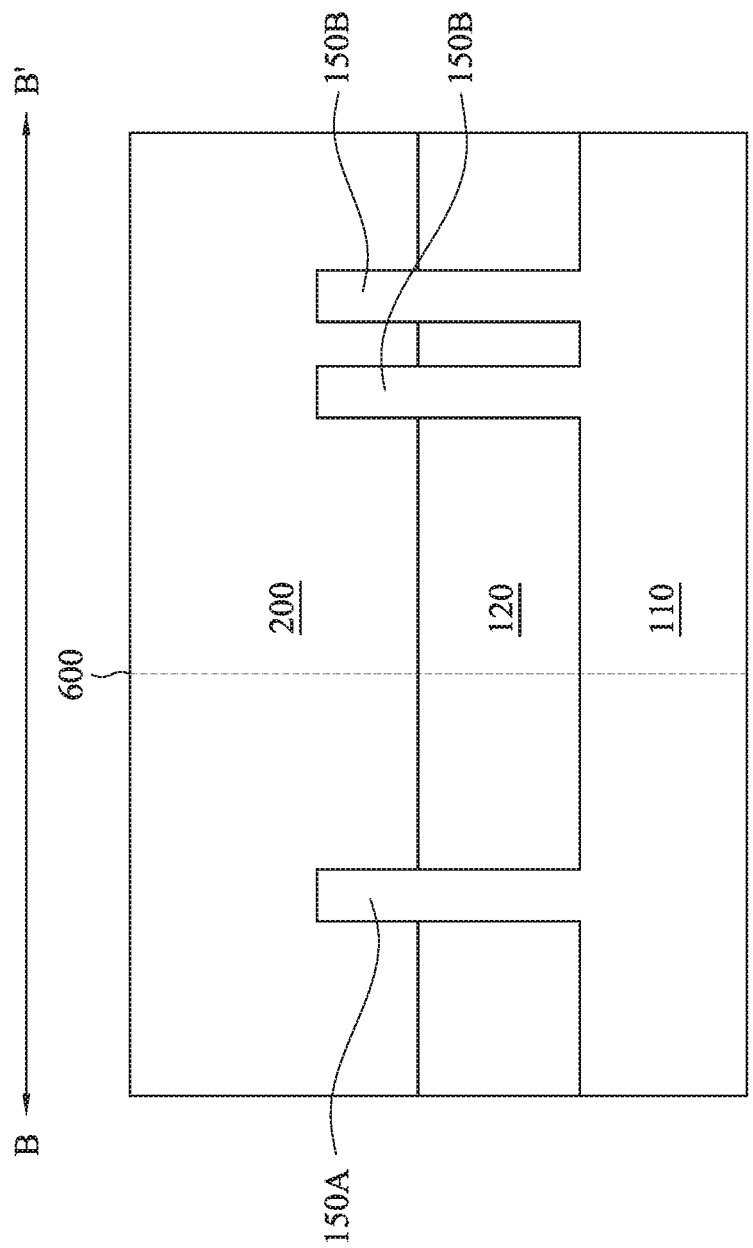

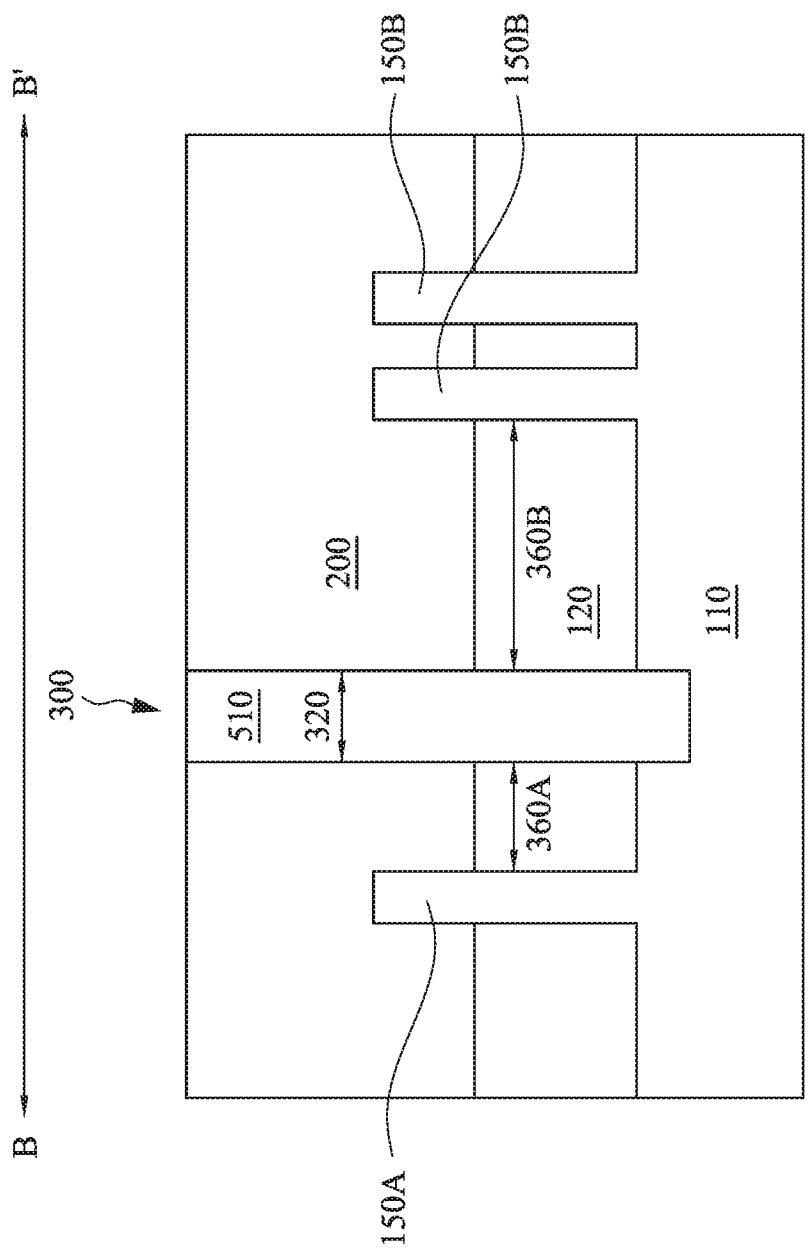

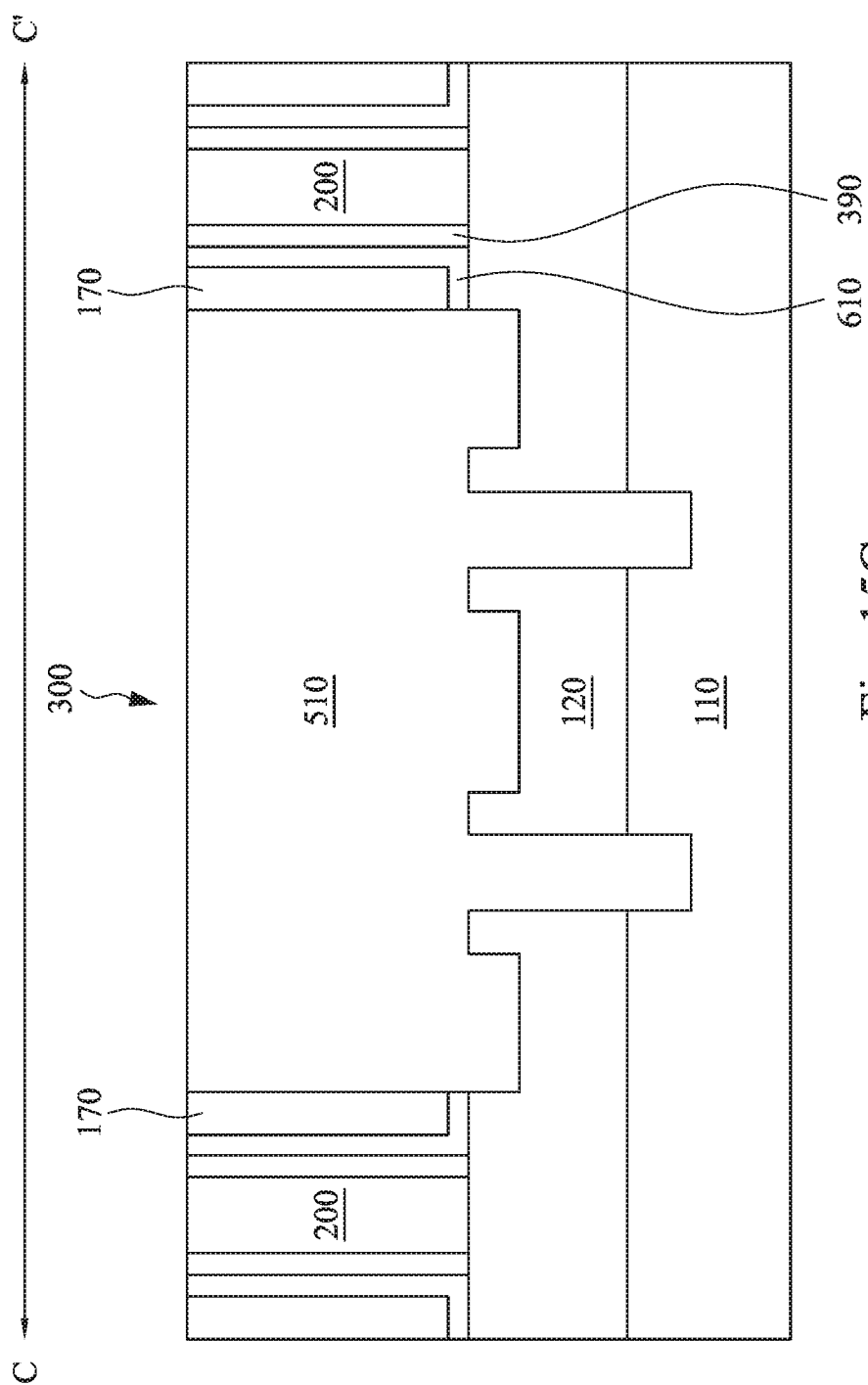

ISOLATION STRUCTURE HAVING DIFFERENT DISTANCES TO ADJACENT FINFET DEVICES

PRIORITY DATA

This application claims benefit of U.S. Provisional Application No. 62/592,510, filed Nov. 30, 2017, herein incorporated by reference in its entirety.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain drawbacks. For example, the fabrication of conventional FinFET devices may involve etching processes that could inadvertently or unintentionally etch away source/drain epitaxial materials.

Therefore, while existing FinFET devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A-12A are different cross-sectional side views of a FinFET device at various stages of fabrication according to various embodiments of the present disclosure.

FIGS. 5B-12B are different cross-sectional side views of a FinFET device at various stages of fabrication according to various embodiments of the present disclosure.

FIGS. 5C-12C are different cross-sectional side views of a FinFET device at various stages of fabrication according to various embodiments of the present disclosure.

FIGS. 13A-15A are different cross-sectional side views of a FinFET device at various stages of fabrication according to various embodiments of the present disclosure.

FIGS. 13B-15B are different cross-sectional side views of a FinFET device at various stages of fabrication according to various embodiments of the present disclosure.

FIGS. 13C-15C are different cross-sectional side views of a FinFET device at various stages of fabrication according to various embodiments of the present disclosure.

FIGS. 13D-15D are different top views of a FinFET device at various stages of fabrication according to various embodiments of the present disclosure.

DETAILED DESCRIPTION

Figure 1:
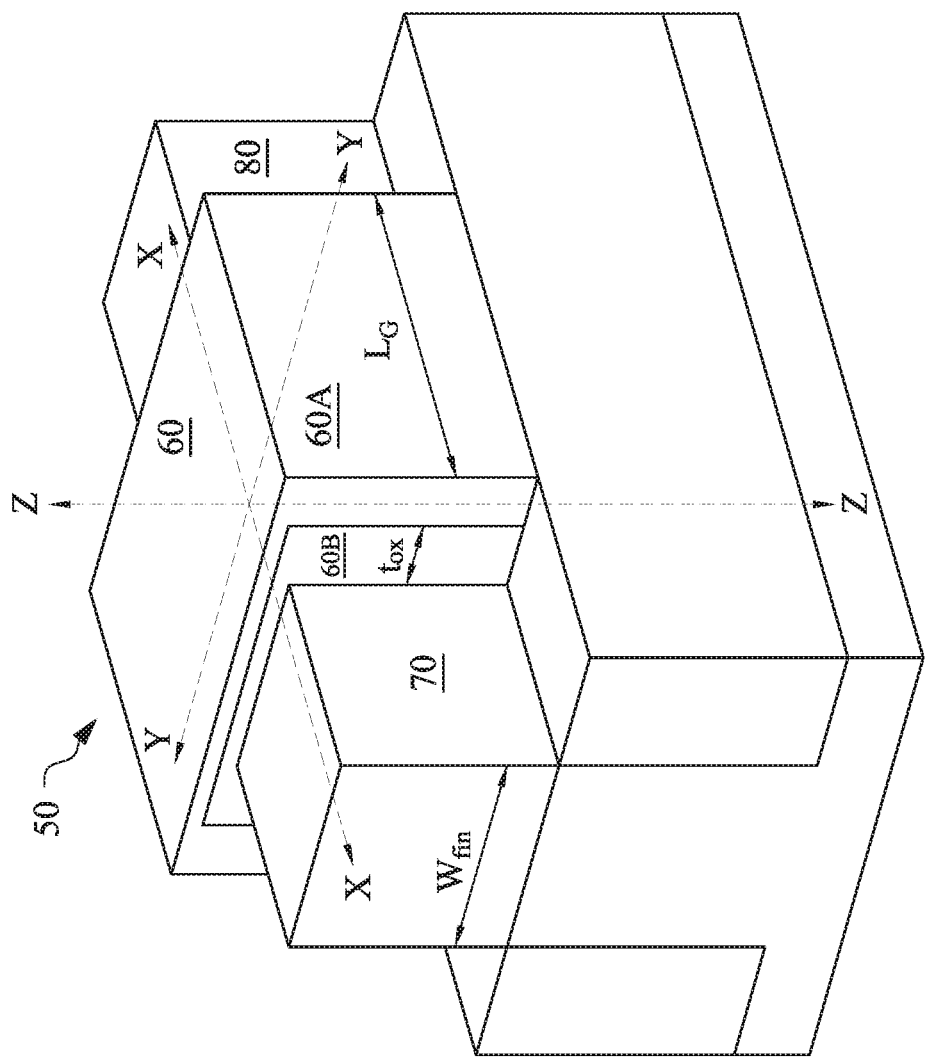
FIG. 1 is a perspective view of an example FinFET device.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure forms the body of the FinFET device 50. The fin has a fin width $W_{fin}$. A gate 60 of the FinFET device 50 is wrapped around this fin. Lg denotes a length (or width, depending on the perspective) of the gate 60. The gate 60 may include a gate electrode component 60A and a gate dielectric component 60B. The gate dielectric 60B has a thickness $t_{ox}$. A portion of the gate 60 is located over a dielectric isolation structure such as shallow trench isolation (STI). A source 70 and a drain 80 of the FinFET device 50 are formed in extensions of the fin on opposite sides of the gate 60. The FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, FinFET fabrication may still have shortcomings. For example, FinFET devices typically grow an epitaxial layer on their fins to serve as the source/drain of the FinFET transistor. Gate structures are then formed over the fins. An isolation structure may be implemented to provide electrical isolation between the gate structures of adjacent FinFET devices. In forming such isolation structure, one or more etching processes may be performed to etch a recess between adjacent FinFET devices. However, conventional methods of fabricating FinFET devices have not taken necessary precautions to avoid etching into the source/drain regions when the recess is etched as a part of the isolation structure formation. The inadvertent or unintentional etching of the source/drain regions may damage the source/drain regions, thereby degrading the performance of the FinFET device, or it may render the FinFET device defective.

To avoid the unintentional etching of the source/drain regions, the present disclosure performs the etching of the recess (through the low-k dielectric material) in a manner such that the etched recess is not equidistant to the adjacent FinFET devices that are located on opposing sides of the etched recess. Instead, the recess (and thus the isolation structure subsequently formed within the recess) will be formed substantially closer to a FinFET device located on one side of the recess than to the FinFET device located on the other side of the recess. The FinFET device that is located closer to the recess may have a smaller source/drain region (which makes it less prone to being inadvertently etched), or it may have a source/drain region that is more etching resistant (which allows it to better withstand the etching chemicals). As a result, the overall FinFET device performance may be improved. The various aspects of the present disclosure will now be discussed below in more detail with reference to FIGS. 2-4, 5A-12A, 5B-12B, 5C-12C, 13A-15A, 13B-15B, 13C-15C, 13D-15D, and 16 below.

Figure 2:
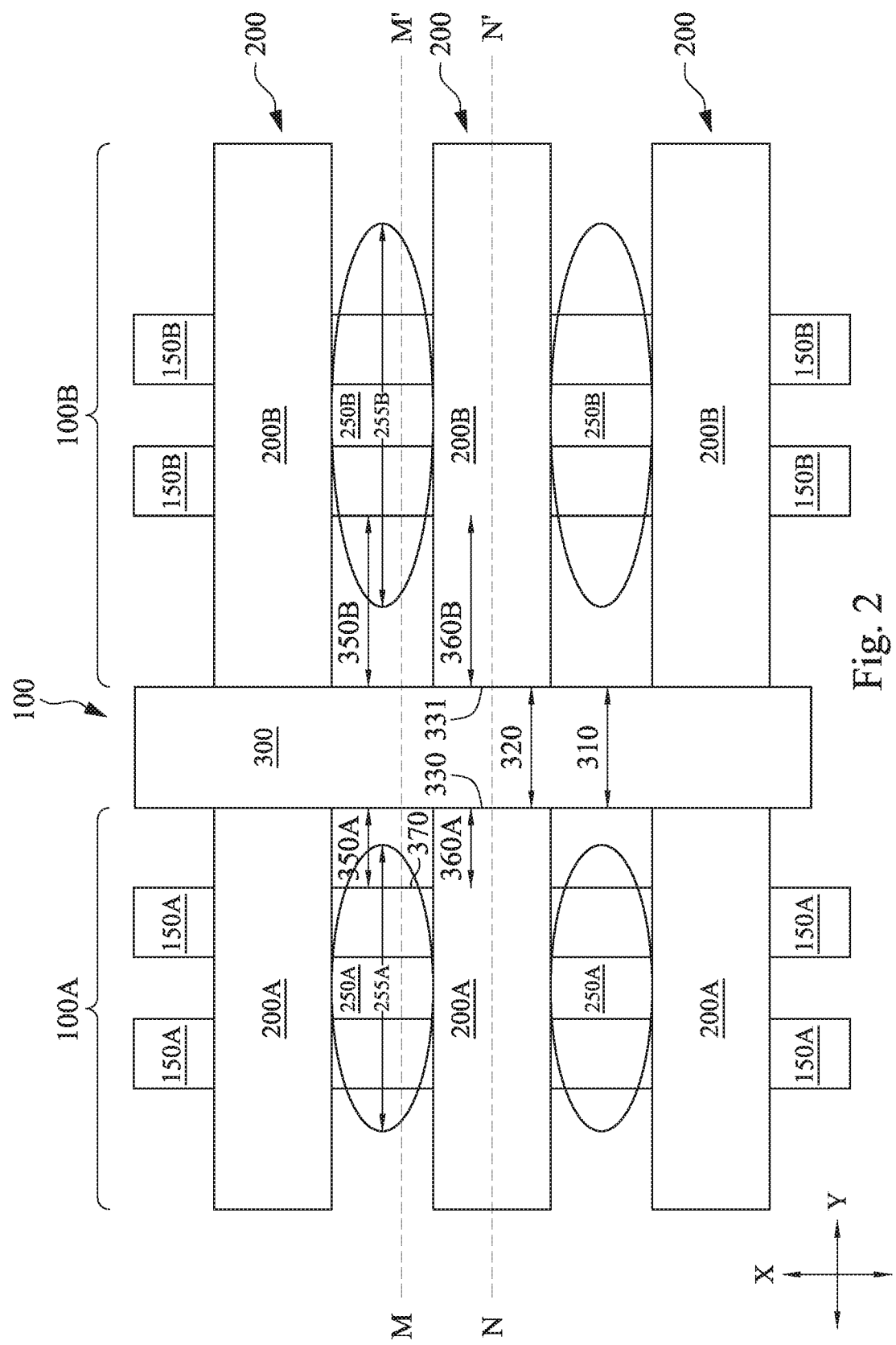
FIG. 2 is a top view of a FinFET device according to various embodiments of the present disclosure.
Figure 3:
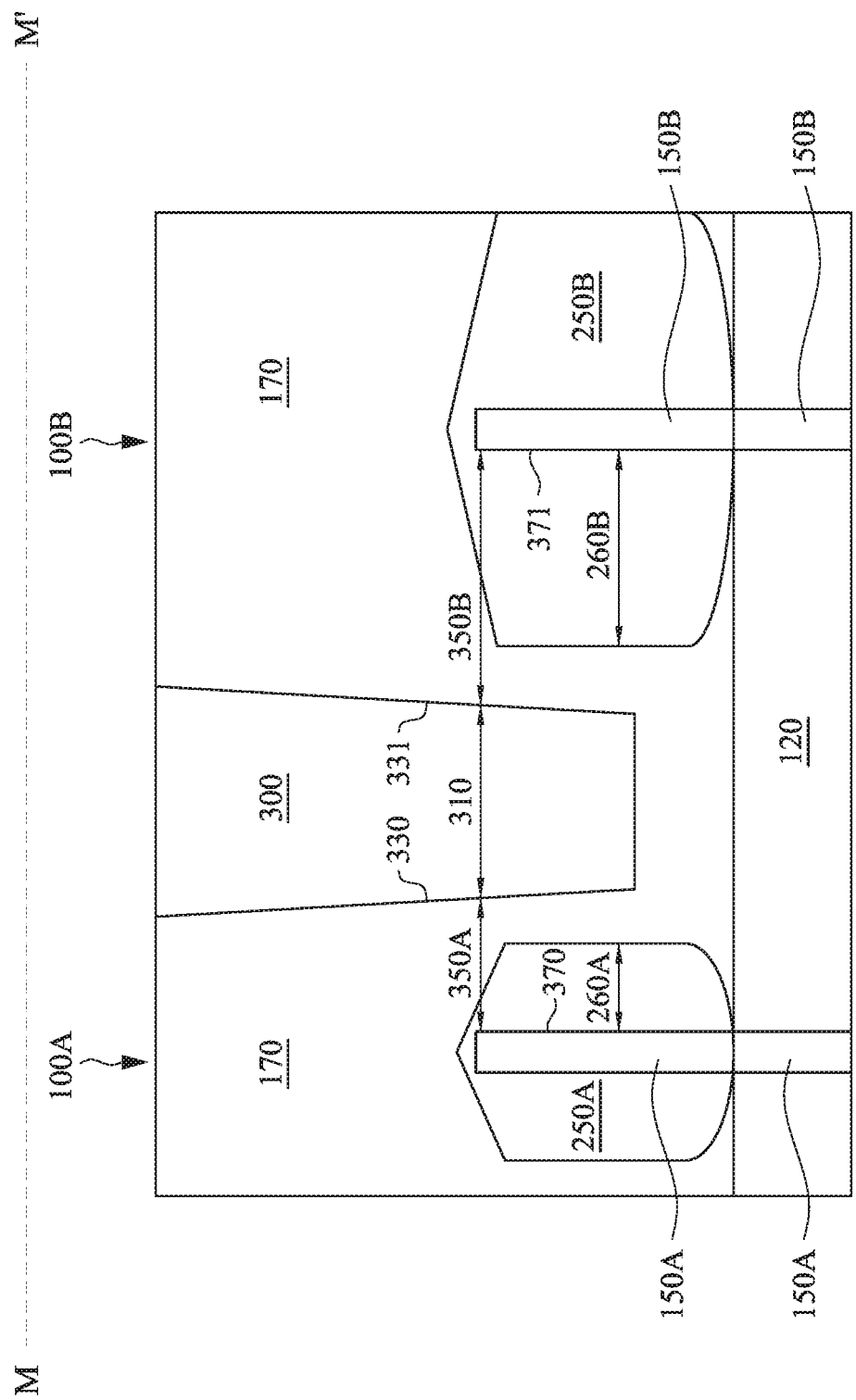
FIG. 3 is a cross-sectional side view of a FinFET device according to various embodiments of the present disclosure.
Figure 4:
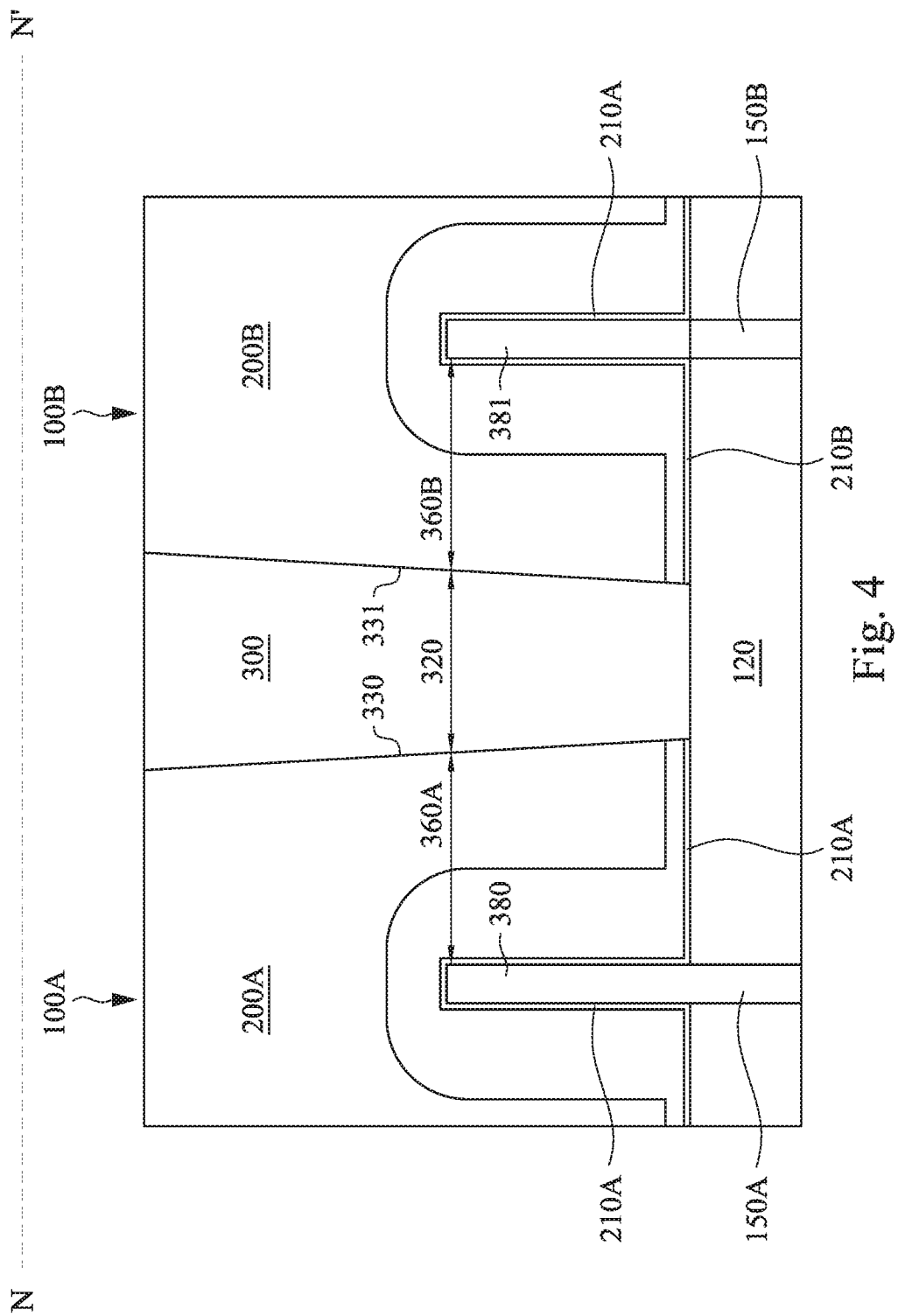
FIG. 4 is a cross-sectional side view of a FinFET device according to various embodiments of the present disclosure.

FIG. 2 illustrates a diagrammatic fragmentary top view of a FinFET device 100 according to an embodiment of the present disclosure. FIGS. 3 and 4 each illustrate a diagrammatic cross-sectional side view of the FinFET device 100, where the cross-sectional side view of the FinFET device 100 in FIG. 3 is taken along a cut M-M' shown in the top view of FIG. 2, and the cross-sectional side view of the FinFET device 100 in FIG. 4 is taken along a cut N-N' shown in the top view of FIG. 2.

The FinFET device 100 is fabricated over a substrate. In some embodiments, the substrate includes a semiconductor material such as silicon. Other suitable materials may also be used for the substrate in alternative embodiments. A semiconductor layer may be formed over the substrate. In an embodiment, the semiconductor layer includes a crystal silicon material. In other embodiments, the semiconductor layer may include silicon germanium. An implantation process (e.g., an anti-punch-through implantation process) may be performed to implant a plurality of dopant ions to the semiconductor layer. The dopant ions may include an n-type material in some embodiments, for example arsenic (As) or phosphorous (P), or they may include a p-type material in some other embodiments, for example boron (B), depending on whether an NMOS or a PMOS is needed.

In the illustrated embodiment, the FinFET device 100 includes at least a FinFET device 100A and a FinFET device 100B, where the FinFET device 100A and the FinFET device 100B are different types of devices. For example, the FinFET device 100A may be a PFET (or PMOS), while the FinFET device 100B may be an NFET (or NMOS), or vice versa. Due to the FinFET devices 100A and 100B being different types of devices, they may have different characteristics, such as different sizes/shapes for their respective source/drain regions, or different etching characteristics of their respective source/drain regions, as discussed in more detail later.

As shown in FIGS. 3-4, dielectric isolation structures 120 such as shallow trench isolation (STI) are formed over portions of the semiconductor layer. The FinFET device 100 also includes a plurality of fin structures, for example fin structures 150A belonging to the FinFET device 100A and fin structures 150B belonging to the FinFET device 100B. The fin structures 150A and 150B protrude upwardly in the Z-direction. In various embodiments, the fin structures 150A or 150B may include, but are not limited to, Si, SiGe, Ge, a III-V group compound, or graphene. As shown in FIGS. 3-4, the fin structures 150A and 150B protrude upwards and out of the isolation structures 120. In other words, at least a portion of each fin structure 150A or 150B is not covered by the isolation structures 120. Also as shown in the top view of FIG. 2, the fin structures 150A and 150B are elongated structures that each extend in the X-direction (i.e., the same X-direction that is shown in FIG. 1).

An inter-layer dielectric (ILD) 170 may be formed over the isolation structures 120 and over portions of the fin structures 150A and 150B. In some embodiments, the ILD 170 may include a low-k dielectric material. In some other embodiments, the ILD 170 may contain silicon oxide. The ILD 170 may be formed by a suitable deposition process followed by a polishing process such as chemical-mechanical-polishing (CMP), so as to planarize the upper surface of the ILD 170.

Gate structures 200 are formed over (and partially wrapping around) the fin structures 150A and 150B. The gate structures 200 include gate structures 200A for the FinFET device 100A and gate structures 200B for the FinFET device 100B. The gate structures 200A and 200B each extend in the Y-direction of FIG. 2 (i.e., the same Y-direction that is shown in FIG. 1).

In some embodiments, the gate structures 200 are high-k metal gate structures. The high-k metal gate structures may be formed in a gate replacement process, in which a dummy gate dielectric and a dummy gate electrode are replaced by a high-k gate dielectric and a metal gate electrode. A high-k dielectric material is a material having a dielectric constant that is greater than a dielectric constant of $SiO_2$, which is approximately 4. In an embodiment, the high-k gate dielectric includes hafnium oxide ($HfO_2$), which has a dielectric constant that is in a range from approximately 18 to approximately 40. In alternative embodiments, the high-k gate dielectric may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO.

As a non-limiting example, the high-k gate dielectric is illustrated in FIG. 4 as a high-k gate dielectric 210A and a high-k gate dielectric 210B. The high-k gate dielectric 210A is formed on the side and upper surfaces a portion of the fin structure 150A of the FinFET device 100A, and the high-k gate dielectric 210B is formed on the side and upper surfaces a portion of the fin structure 150B of the FinFET device 100B.

The metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure 400. In various embodiments, the fill metal component may contain Aluminum (Al), Tungsten (W), Copper (Cu), or combinations thereof.

The FinFET device 100 also includes source/drain regions, for example source/drain regions 250A for the FinFET device 100A and source/drain regions 250B for the FinFET device 100B. The source/drain regions 250A and 250B may each be formed using one or more epitaxial growth processes, and as such they are epitaxially-grown structures. In various embodiments, the source/drain regions 250A or 250B may include, but are not limited to, Si, SiP, SiAs, SiGe, Ge, a III-V group compound semiconductor, or graphene.

According to the various aspects of the present disclosure, the source/drain regions 250A and 250B have different characteristics. For example, in some embodiments, the source/drain regions 250A and 250B have different geometric profiles. The difference in their geometric profiles may refer to their sizes or dimensions. In some embodiments, the source/drain region 250A is substantially smaller than the source/drain region 250B, at least in terms of their respective lateral dimensions. For example, as shown in FIG. 2, the source/drain region 250A may have a lateral dimension 255A (measured in the Y-direction), and the source/drain region 250B may have a lateral dimension 255B (measured in the Y-direction), where the dimension 255B is substantially greater than the dimension 255A.

The size difference between the source/drain regions 250A and 250B is also shown in the cross-sectional side view of FIG. 3. For example, the source/drain region 250A has a lateral dimension 260A (which is a part of the dimension 255A) in the Y-direction (i.e., the Y-direction shown in FIGS. 1 and 2), where the dimension 260A is measured from an outer side surface of the fin structure 150A to an outer side surface of the source/drain region 250A. In some embodiments, the dimension 260A is in a range between about 3 nanometers (nm) and about 30 nm. Similarly, the source/drain region 250B has a lateral dimension 260B (which is a part of the dimension 255B) in the Y-direction, where the dimension 260B is measured from an outer side surface of the fin structure 150B to an outer side surface of the source/drain region 250B. In some embodiments, the dimension 260B is in a range between about 3 nanometers (nm) and about 30 nm.

As shown in FIG. 3, the dimension 260B is substantially greater than the dimension 260A, for example at least 25% greater in some embodiments, at least 50% greater in some other embodiments, or at least 100% greater in yet other embodiments. The size difference between the source/drain region 250A and the source/drain region 250B may be attributed to the fact that the FinFET device 100A and the FinFET device 100B are different types of devices, for example one of the FinFET devices 100A and 100B may be an NFET, while the other one of the FinFET devices 100A and 100B may be a PFET. The size difference between the source/drain region 250A and the source/drain region 250B also means that, when an etching process is performed etch an opening in the ILD 170 and the gate structure 200 (which is done to form an isolation structure 300, as discussed below in more detail), the larger source/drain region 250B is more prone to being inadvertently etched, especially if there are alignment or overlay issues. Thus, the present disclosure will etch the opening at a spot not right in the middle between the FinFET devices 100A and 100B, but closer to the FinFET device with the smaller source/drain region (e.g., the FinFET device 100A in the embodiment shown in FIG. 3). By doing so, the size difference between the source/drain regions 250A and 250B will be accounted for, and the larger source/drain region is less likely to be inadvertently etched.

Another difference in the characteristics between the source/drain region 250A and the source/drain region 250B may be their resistance to etching. As discussed above, since the FinFET devices 100A and 100B may be different types of FinFET devices, different materials may be used to form the source/drain regions 250A and 250B for the FinFET devices 100A and 100B, respectively. For example, source/drain regions for PFETs may include SiGe, while source/drain regions for NFETs may include SiC or SiP. Some of these materials may be more resistant to etching than others. For example, when $Cl_2$ is used as an etchant in an etching process, SiGe is more resistant to etching than SiP. As another example, when $CF_4$ is used as an etchant in an etching process, SiP is more resistant to etching than SiGe. The greater resistance to etching means that the material may not suffer as much damage as the other materials even if the etching process discussed above (to form the isolation structure 300) is inadvertently performed on them. In some cases, the difference resistance to etching between the source/drain regions 250A and 250B may be measured in terms of their etching rates in response to the etching process discussed above. The source/drain region having a lower etching rate means that it is more etching resistant than the other source/drain region. Since one goal of the present disclosure is to reduce the harmful effects caused by the inadvertent or unintentional etching of either of the source/drain regions 250A or 250B, the present disclosure will try to perform the etching of the ILD 170 at a spot that is closer to the more etching resistant one of the source/drain regions 250A or 250B.

For the sake of providing an example, the source/drain region 250A is more etching resistant than the source/drain region 250B in the illustrated embodiment, for example when the etchant is $Cl_2$, and the source/drain region 250A includes SiGe while the source/drain region 250B includes SiP. Thus, the etching process will be performed at a location that is closer to the source/drain region 250A than to the source/drain region 250B. In this manner, even if the etching process is too close to the source/drain region 250A and as such exposes the source/drain region 250A to the etching chemicals, the source/drain region 250A is better able to withstand the etching chemicals without being damaged too much (as opposed to the "weaker" source/drain region 250B being exposed to the etching chemicals). In other embodiments where the source/drain region 250B is offers more etching resistance than the source/drain region 250A (for example when the etchant is $CF_4$, and the source/drain region 250B includes SiP, while the source/drain region 250A includes SiGe), the etching process may be performed to form an opening closer to the source/drain region 250B for the same reasons discussed above.

The opening (in the ILD 170) formed by the etching process discussed above will be filled in order to form the isolation structure 300. In some embodiments, the isolation structure 300 includes an electrically insulating material, for example a suitable dielectric material. The dielectric material of the isolation structure 300 may still be different from the dielectric material used for the ILD 170. As shown in the top view of FIG. 2, the isolation structure 300 is elongated and extends in the X-direction (i.e., the same X-direction shown in FIG. 1). Due to its position of being located in between the FinFET devices 100A and 100B, the isolation structure 300 provides electrical isolation between the FinFET devices 100A and 100B, for example electrical isolation between the gate structures 200A and 200B. Good electrical isolation between the gate structures 200A and 200B will result in lower noise or interference between the FinFET devices 100A and 100B, and thus better performance of the FinFET device 100 as a whole.

The lateral dimension (or width) of the isolation structure 300 in the Y-direction may be measured in at least two different regions. For example, as shown in FIGS. 2 and 3, the isolation structure 300 may have a dimension 310 in the Y-direction. The dimension 310 is measured at a portion of the isolation structure 300 that is embedded within (or surrounded by) the ILD 170. In some embodiments, the dimension 310 is in a range between about 3 nm and about 100 nm.

As another example, as shown in FIGS. 2 and 4, the isolation structure 300 may also have a dimension 320 in the Y-direction. The dimension 320 is measured at a portion of the isolation structure 300 that is embedded within (or surrounded by) the gate structure 200. One sidewall 330 of the isolation structure 300 borders a sidewall of one of the gate structures 200A, while another sidewall 331 (opposite of the sidewall 330) of the isolation structure 300 borders another sidewall of one of the gate structures 200B. Had the isolation structure 300 not been formed, the gate structures 200A and 200B would have remained as a continuous gate structure 200. Thus, it may be said that the isolation structure 300 "cuts" the continuous gate structure 200 into two separate and distinct segments (i.e., the gate structure 200A for the FinFET device 100A and the gate structure 200B for the FinFET device 100B, respectively). In some embodiments, the dimension 320 is in a range between about 5 nm and about 100 nm.

As discussed above, the present disclosure does not form the isolation structure 300 exactly in the middle between the two FinFET devices 100A and 100B. In other words, the isolation structure 300 is not equidistant to the nearest fin structure 150A on one side and the nearest fin structure 150B on the other side. Instead, the isolation structure is formed to be closer to the FinFET device that has a smaller source/drain region in some embodiments, or it may be formed to be closer to the FinFET device that has a more etching resistant source/drain region in some embodiments. In some cases, the FinFET device that has the smaller source/drain region is also the FinFET device that has the more etching resistant source/drain region. In any case, as an illustrative example, suppose that the FinFET device 100A herein has a smaller source/drain region 250A (or a more etching resistant source/drain region 250A), and therefore the isolation structure 300 is formed to be closer to the FinFET device 100A. As discussed above, the closer distance to the FinFET device 100A reduces the likelihood of the source/drain regions being inadvertently etched when an etching process is performed to form the isolation structure 300, and/or any inadvertent etching of the source/drain regions—if it indeed occurs—does not pose a significant problem anyway.

The distances between the isolation structure 300 and the FinFET devices 100A and 100B may be measured by distances 350A-350B and 360A-360B, all measured in the Y-direction. In more detail, as shown in FIGS. 2-3, the distance 350A is measured from the sidewall 330 of the isolation structure 300 to a sidewall 370 of the fin structure 150A, and the distance 350B is measured from the sidewall 331 of the isolation structure 300 to a sidewall 371 of the fin structure 150B. The distances 350A and 350B are measured from a region of the FinFET device 100 where gate structures 200 are not present. In some embodiments, the distance 350A is in a range between about 2 nm and about 40 nm, and the distance 350B is also in a range between about 2 nm and about 40 nm. However, since the isolation structure 300 is closer to the FinFET device 100A, the distance 350A is smaller than the distance 350B. In some embodiments, the difference between the distance 350B and 350A is at least 2 nm, for example such difference may be in a range between about 2 nm and about 30 nm. The distance 350B may be at least 25% larger than the distance 350A in some embodiments, or at least 50% larger in some other embodiments, or at least 100% larger in yet other embodiments.

As shown in FIGS. 2 and 4, the distance 360A is measured from the sidewall 330 of the isolation structure 300 to a sidewall 380 of the fin structure 150B, and the distance 360B is measured from the sidewall 331 of the isolation structure 300 to a sidewall 381 of the fin structure 150B. The distances 360A and 360B are measured from a region of the FinFET device 100 where gate structures 200 are present. In some embodiments, the distance 360A is in a range between about 4 nm and about 40 nm, and the distance 360B is also in a range between about 4 nm and about 40 nm. However, since the isolation structure 300 is closer to the FinFET device 100A, the distance 360A is smaller than the distance 360B. In some embodiments, the difference between the distance 360B and 360A is at least 2 nm, for example such difference may be in a range between about 2 nm and about 30 nm. The distance 360B may be at least 25% larger than the distance 360A in some embodiments, or at least 50% larger in some other embodiments, or at least 100% larger in yet other embodiments. It is understood that the distance 350A may not be necessarily equal to the distance 360A, and that the distance 350B may not necessarily be equal to the distance 360B.

The process flow of fabricating the FinFET device 100 according to aspects of the present disclosure will now be discussed below with reference to FIGS. 5A-12A, 5B-12B, and 5C-12C. For reasons of consistency and clarity, similar components appearing in FIGS. 2-4 and FIGS. 5A-12A, 5B-12B, and 5C-12C will be labeled the same.

In more detail, FIGS. 5A-12A are fragmentary cross-sectional side views of the FinFET device 100 at different stages of fabrication, where the cross-section is taken along the X-direction in FIG. 1. FIGS. 5B-12B and FIGS. 5C-12C are fragmentary cross-sectional side views of the FinFET device 100 at different stages of fabrication, where the cross-section is taken along the Y-direction in FIG. 1. As such, FIGS. 5A-12A may be referred to as X-cuts, and FIGS. 5B-12B and 5C-12C may be referred to as Y-cuts. Though FIGS. 5B-12B and 5C-12C each illustrate a cross-sectional cut taken in the Y-direction, they are taken at different regions of the FinFET device 100. For example, the cross-sectional cuts in FIGS. 5B-12B are taken at a region corresponding to one of the gate structures 200, but the cross-sectional cuts in FIGS. 5C-12C are taken at a region corresponding to the ILD 170. In other words, FIGS. 5B-12B illustrate a region similar to the region shown in FIG. 4 (e.g., cross-sectional cut taken along N-N'), whereas FIGS. 5C-12C illustrate a region similar to the region shown in FIG. 3 (e.g., cross-sectional cut taken along M-M').

Figure 5C:
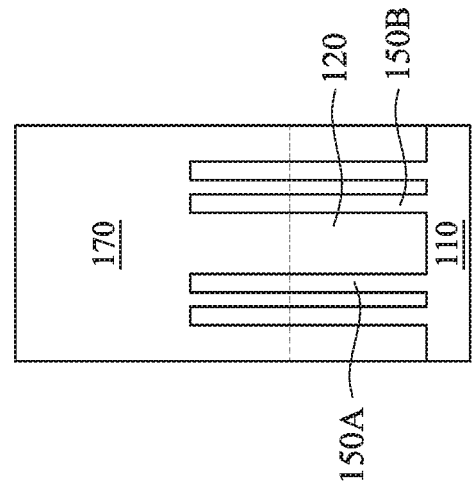
Figure 5B:
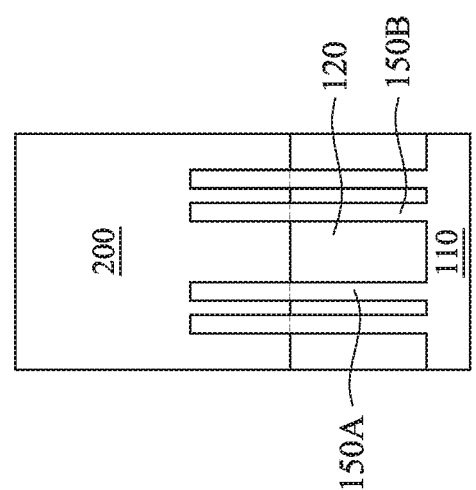

Referring now to FIGS. 5A-5C, the high-k metal gates discussed above have been formed. In other words, the dummy gate dielectric (e.g., silicon oxide gate dielectric) and dummy gate electrode (e.g., polysilicon gate electrode) are removed and replaced by a high-k gate dielectric and a metal gate electrode, in order to form the gate structures 200. The gate structures 200 may have spacers 390 formed on their sidewalls. The spacers 390 may include dielectric materials such as silicon oxide, silicon nitride, or silicon oxynitride, etc. It is understood that a polishing process such as chemical mechanical polishing (CMP) may be performed to planarize an upper surface of the gate structures 200 and the ILD 170.

As shown in FIG. 5B, the gate structure 200 wraps around a portion of each of the fin structures 150A and 150B, where the fin structures 150A and 150B are formed over a substrate 110. In some embodiments, the substrate 110 may correspond to the semiconductor layer from which the fin structures 150A and 150B are formed. In any case, the subsequent processes will form an opening that extends through the gate structure 200 and between the fin structures 150A and 150A, and the opening will then be filled to form the isolation structure 300 discussed above. It is also understood that the source/drain regions such as the source/drain regions 250A and 250B discussed above have already been formed at this stage of fabrication, but they are not specifically illustrated herein for reasons of simplicity. In other words, the portions of the fin structures 150A and 150B shown in FIG. 5B (and in FIGS. 6B-12B) represent both the fin structure itself, as well as the epitaxially grown source/drain regions, such as the source/drain regions 250A or 250B discussed above.

Figure 6A:
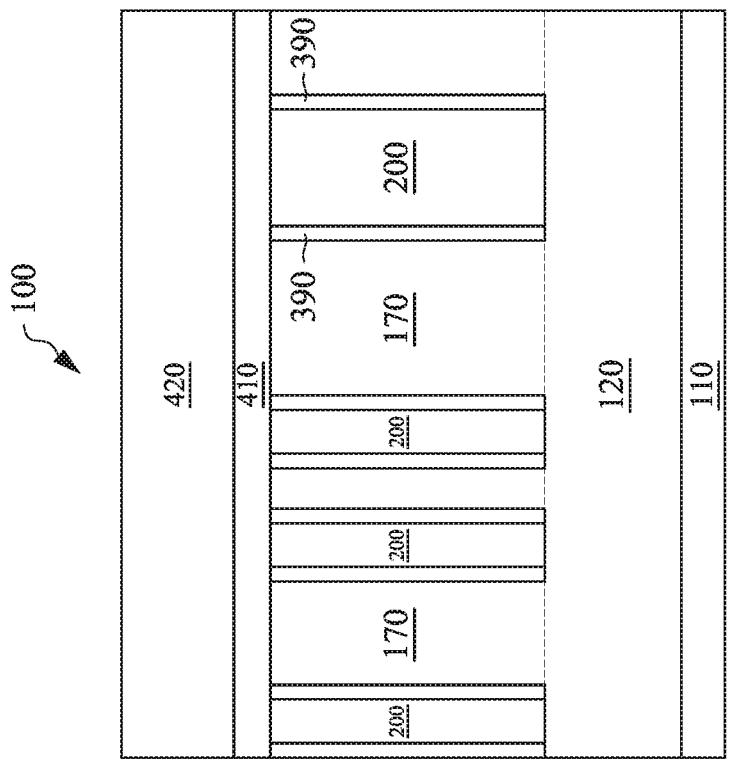

Referring now to FIGS. 6A-6C, a hardmask layer 410 is formed over the planarized upper surface of the gate structures 200 and the ILD 170, and another hardmask layer 420 is formed over the hardmask layer 410. In some embodiments, the hardmask layer 410 includes a first type of dielectric material, and the hardmask layer 420 includes a second type of dielectric material different from the first type. For example, the first type of dielectric material may include silicon oxide, while the second type of dielectric material may include silicon nitride, or vice versa. In some embodiments, one of the hardmask layers 410-420 is formed, but not both.

Figure 7A:
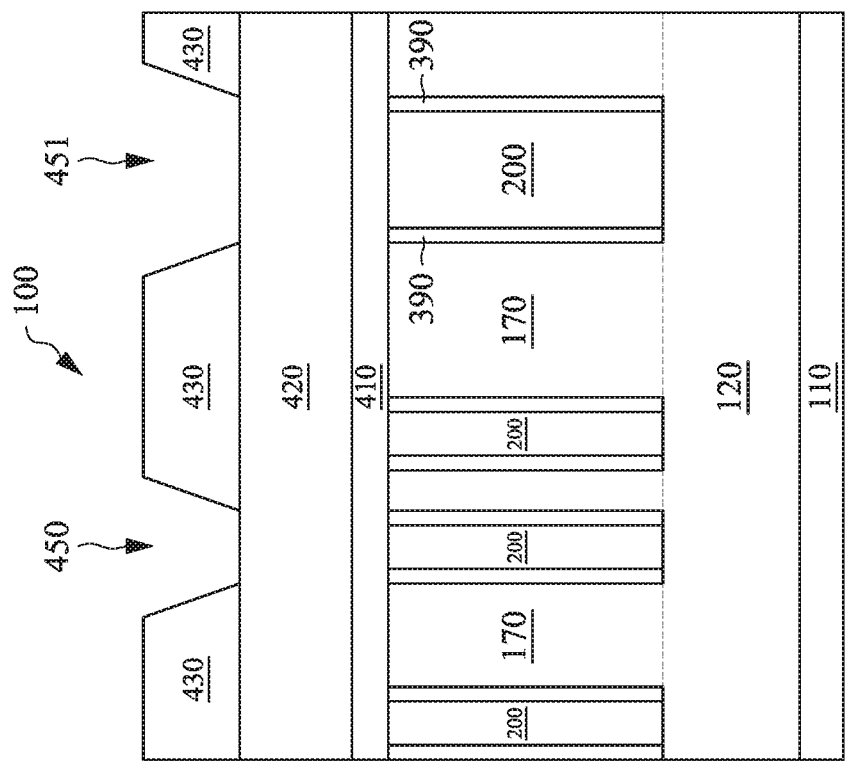

Referring now to FIGS. 7A-7C, a patterned photoresist layer 430 is formed over the hard mask layer 420. The photoresist layer 430 may be formed by one or more lithography processes such as spin coating, exposing, post-exposure baking, developing, etc. The patterned photoresist layer 430 includes openings, for example openings 450, 451, 452, 453 as shown in FIGS. 7A-7C. Note that some of these openings 450-453 may in fact be the same opening, for example the openings 452 and 453 may be illustrating different parts of the same opening.

As shown in FIG. 7A, the openings 450 and 451 are each aligned with (or located above) a respective one of the gate structures 200. This is so that the gate structures 200 disposed below the openings 450 and 451 will be removed in a later process. As shown in FIGS. 7B-7C, the openings 452 and 453 are intentionally formed to be closer to one of the fin structures 150A or 150B, for example closer to the fin structure that has a smaller epitaxially grown source/drain region, or to the fin structure that has a more etching resistant epitaxially grown source/drain region. For the sake of providing an example, suppose the source/drain region of the fin structure 150A is smaller or more etching resistant. As such, the openings 452 and 453 are formed closer to the fin structure 150A.

Figure 8A:
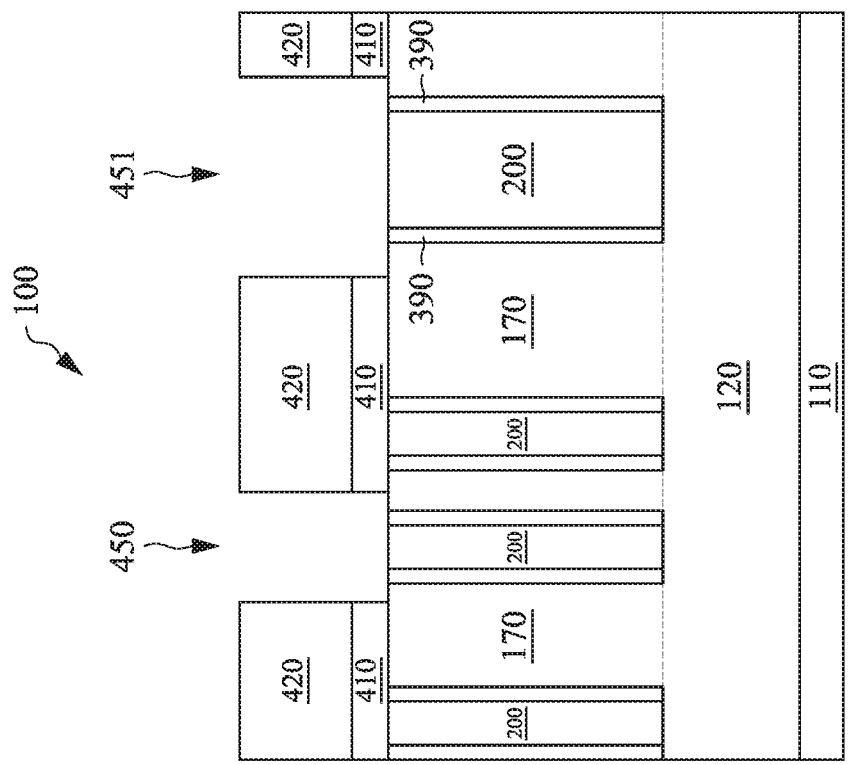

Referring now to FIGS. 8A-8C, the hard mask layers 410 and 420 are patterned using the patterned photoresist layer 430, which transfers the openings 450-453 to the hard mask layers 410-420. The patterned photoresist layer 430 is then removed, for example through a photoresist stripping or ashing process. The openings 450-452 now expose some of the gate structures 200.

Figure 9A:
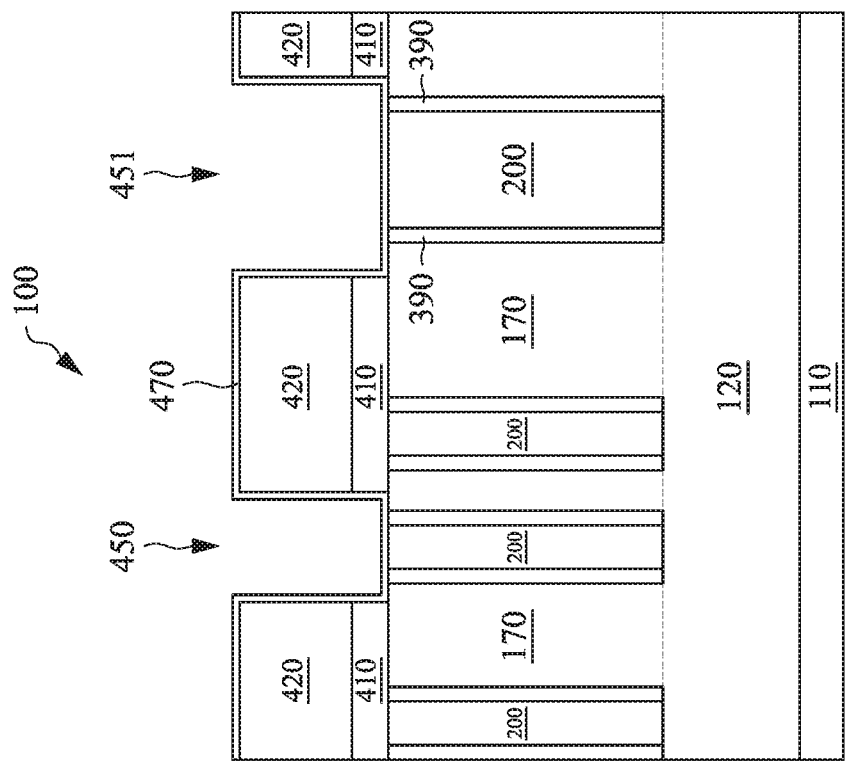

Referring now to FIGS. 9A-9C, a layer 470 may be optionally formed over the hard mask layer 420 and in the openings 450-453. The layer 470 may contain a dielectric material, for example silicon oxide or silicon nitride. As such, similar to the hard mask layers 420/410, the layer 470 may also serve as a protective mask in a subsequent etching process. The presence of the layer 470 in the openings 450-453 effectively reduces the lateral dimension of the openings 450-453. In other words, the layer 470 may be formed to "shrink" the openings 450-453, if that is needed.

Figure 10A:
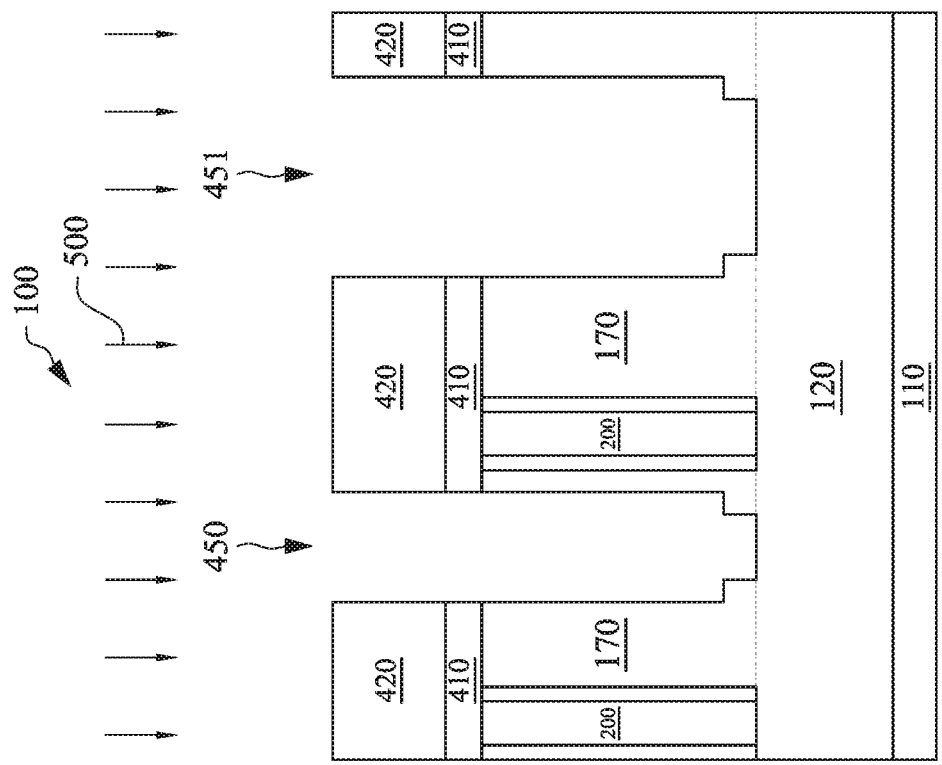

Referring now to FIGS. 10A-10C, regardless of whether the optional layer 470 is formed, the FinFET device 100 is etched via an etching process 500. The etching process 500 etches away portions of the ILD 170 and the gate structures 200 exposed by the openings 450-453, while the hardmask layers 410-420 serve as etching masks to protect the materials underneath from being etched. The openings 450-453 are effectively transferred downwards through the ILD 170 and/or the gate structures 200. For example, the gate structure 200 in FIG. 10B is now cut into gate structures 200A and 200B, which are separated by the opening 452. Since the gate structure 200 is a high-k metal gates (i.e., containing a high-k gate dielectric and a metal gate electrode), and the openings 450-453 are "cut" into the gate structure 200, the openings 450-453 may be referred to as "cut-metal gate" (CMG) openings or trenches.

As discussed above, had the source/drain regions being inadvertently exposed, this etching process 500 would have etched the exposed source/drain regions too. According to the present disclosure, the openings 452-453 are formed to be closer to the smaller source/drain region and away from the larger source/drain region, and thus the larger source/drain region is less likely to be exposed by the openings 452-453 and as such less likely to suffer etching damage due to the etching process 500. In addition, or alternatively, the openings 452-453 are formed closer to the source/drain region with the greater etching resistance. As such, even if that source/drain region is inadvertently exposed by the openings 452-453 and thus subject to the etching chemicals used in the etching process 500, the etching process will cause significantly less damage to the inadvertently etched source/drain region.

Figure 11C:
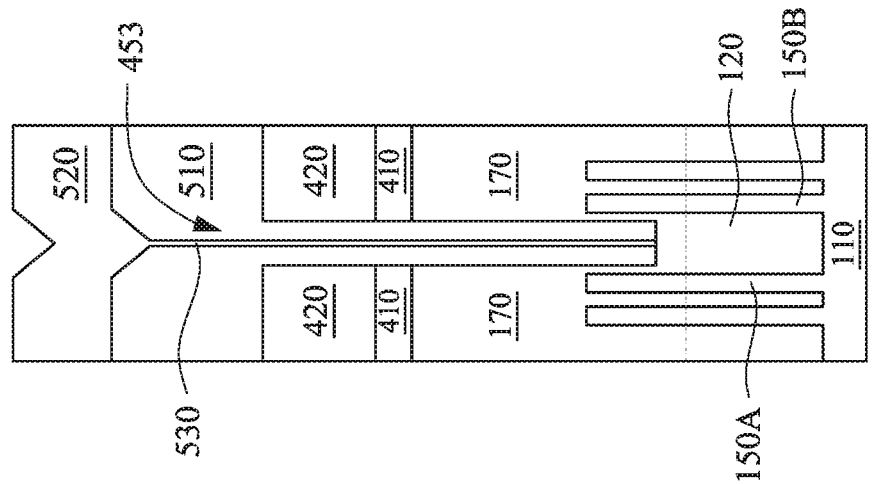
Figure 11B:
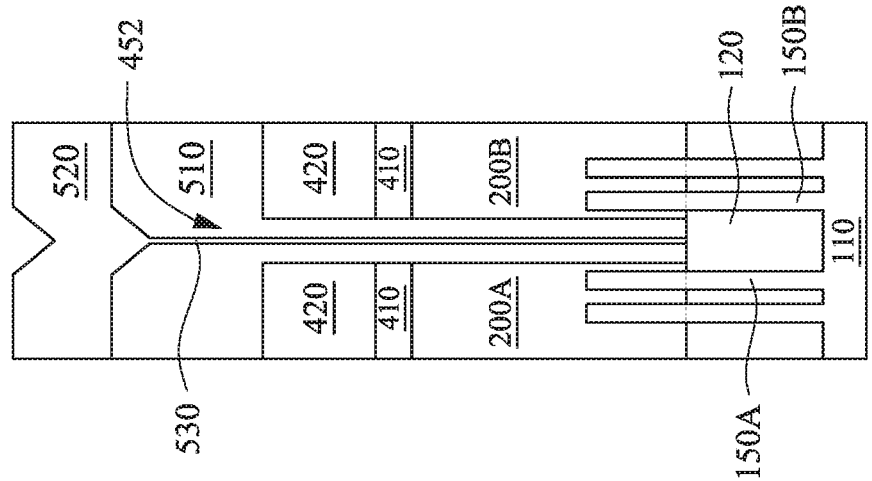

Referring now to FIGS. 11A-11C, a layer 510 is formed to fill the openings 450-451, and a layer 520 is formed over the layer 510. In some embodiments, the layer 510 contains a dielectric material with a good gap-filling or recess-filling characteristic. This is so that the layer 510 can still effectively fill the openings 450-453, even if they are small. In some embodiments, the layer 510 is deposited using an atomic layer deposition (ALD) process, which may be slow but offers good gap-filling performance. In other embodiments, the layer 510 may be deposited using a plasma enhanced chemical vapor deposition (PECVD) process.

In some embodiments, the layer 510 may comprise a single type of dielectric material, such as silicon oxide. Note that even when the layer 510 comprises a single type of dielectric material, it may still have different physical characteristics from other components that comprise the same type of dielectric material, because the other components may be formed using different processes. For example, shallow trench isolation (STI) may comprise silicon oxide, as does the layer 510 in some embodiments. However, the silicon oxide of the STI may be formed by flowable chemical vapor deposition (FCVD), which is different than the PECVD or ALD that forms the silicon oxide of the layer 510. As a result, the silicon oxide of the STI and the silicon oxide of the layer 510 may have different characteristics such as density, or etching rate.

In some other embodiments, the layer 510 may be formed by a plurality of processes and may include a plurality of different layers/materials. For example, the layer 510 may comprise a multi-stack structure with a plurality of layers formed one over another. Since the material composition and the thicknesses of each of the layers in the multi-stack structure is configurable, the overall dielectric constant (k) value of the layer 510 may be specifically configured optimize the functionality of the layer 510, which is to provide electrical isolation between adjacent metal gate structures. In some embodiments, the layer 510 may include low-k oxide or $Al_2O_3$.

Subsequently, the layer 520 may be deposited over the layer 510 using a process such as chemical vapor deposition (CVD), such as a plasma enhanced CVD (PECVD) process. The layer 520 may include a dielectric material different from the dielectric material of the layer 510. This is because the layer 520 is not concerned with the gap-filling performance, since the openings 450-453 have already been filled by the layer 510. The purpose of the layer 520 is to provide a flat or smooth upper surface. Thus, the layer 520 can be a cheaper material, and its deposition may be performed using a process that is not as costly or time-consuming as the ALD process used to form the layer 510. In some embodiments, the layer 510 may include $SiO_2$, SiON, SiOCN, SiCN, SiN, or combinations thereof, and the layer 520 may include $SiO_2$, SiC, or combinations thereof.

Note that in some embodiments, such as in the embodiments shown in FIGS. 11B-11C, the deposition (e.g., ALD) of the layer 510 may leave a seam 530 formed therein. The seam 530 extends vertically at least in part through the previous openings 452-453. In some embodiments, the seam 530 is filled (or at least partially filled) by the subsequently deposited layer 520. In other embodiments, the seam 530 includes one or more air gaps trapped by the layers 510 and 520. In other words, the layer 520 does not fill the seam 530, thereby leaving air trapped inside the seam 530. Since air has a low dielectric constant, the presence of the seam 530 filled with air gaps could improve the low-k dielectric properties of the isolation structure filling the openings 452-453.

Figure 12A:
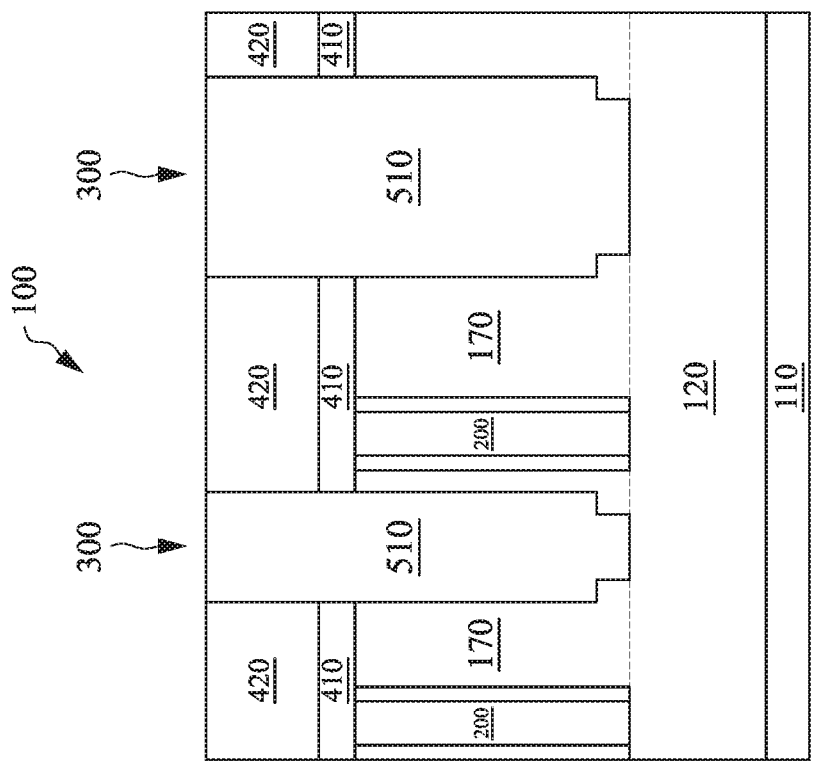
Figure 12C:
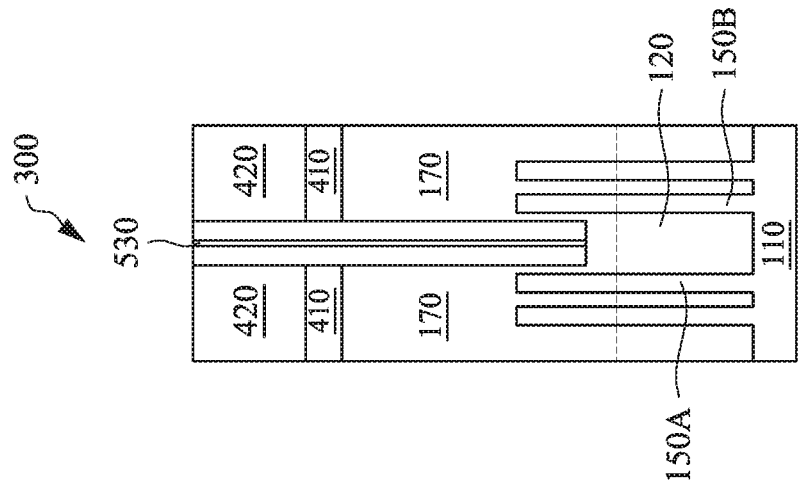
Figure 12B:
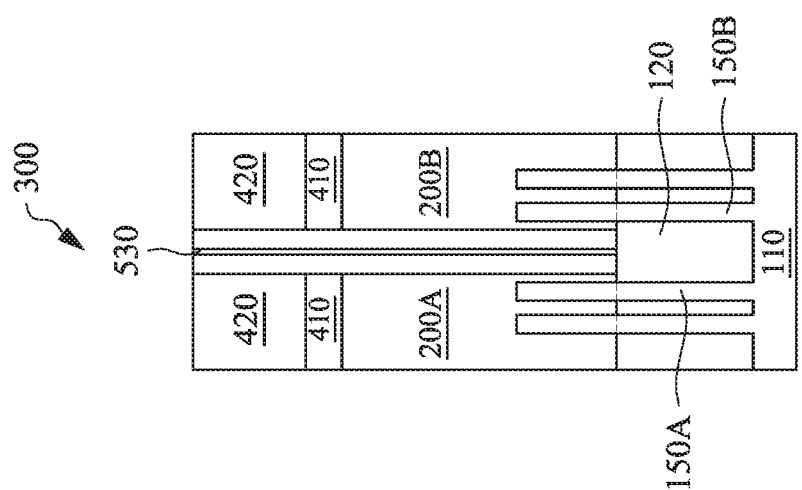

Referring now to FIGS. 12A-12C, a polishing process is performed to remove the portions of the layers 510 and 520 formed outside of the openings 450-453 and to planarize the upper surface of the portion of the layer 510 formed inside the openings 450-453. The remaining portions of the layer 510 form the isolation structure 300 discussed above. The isolation structure 300 may be referred to as "cut-metal-gate" (CMG) structures, since they provide electrical isolation between adjacent high-k metal gates.

In embodiments where the seam 530 is formed, the isolation structure 300 may also include the seam 530, which as discussed above may include air gaps and/or portions of the layer 520. The isolation structures 300 herein not only provide electrical isolation between the gate structures 200, but they also reduce the likelihood of the source/drain regions being damaged (or reduce the adverse impacts of the damage) from the etching process 500 used to form the isolation structures 300.

The various aspects of the present disclosure are further described below with reference to FIGS. 13A-15A, 13B-15B, 13C-15C, and 13D-15D, which provide more realistic representations of the devices and processes of the present disclosure. In more detail, FIGS. 13A-15A, 13B-15B, and 13C-15C illustrate different cross-sectional side views (taken at different locations) of the FinFET device 100 discussed above at different stages of fabrication, and FIGS. 13D-15D illustrate top views of the FinFET device 100 at different stages of fabrication. For reasons of consistency and clarity, the same elements that appear in FIGS. 2-4 and 5A-12A, 5B-12B, and 5C-12C are labeled the same in FIGS. 13A-15A, 13B-15B, 13C-15C, and 13D-15D. It is understood that the top views of FIGS. 13D-15D are rotated 90 degrees compared to the top view shown in FIG. 2 discussed above.

Figure 13A:
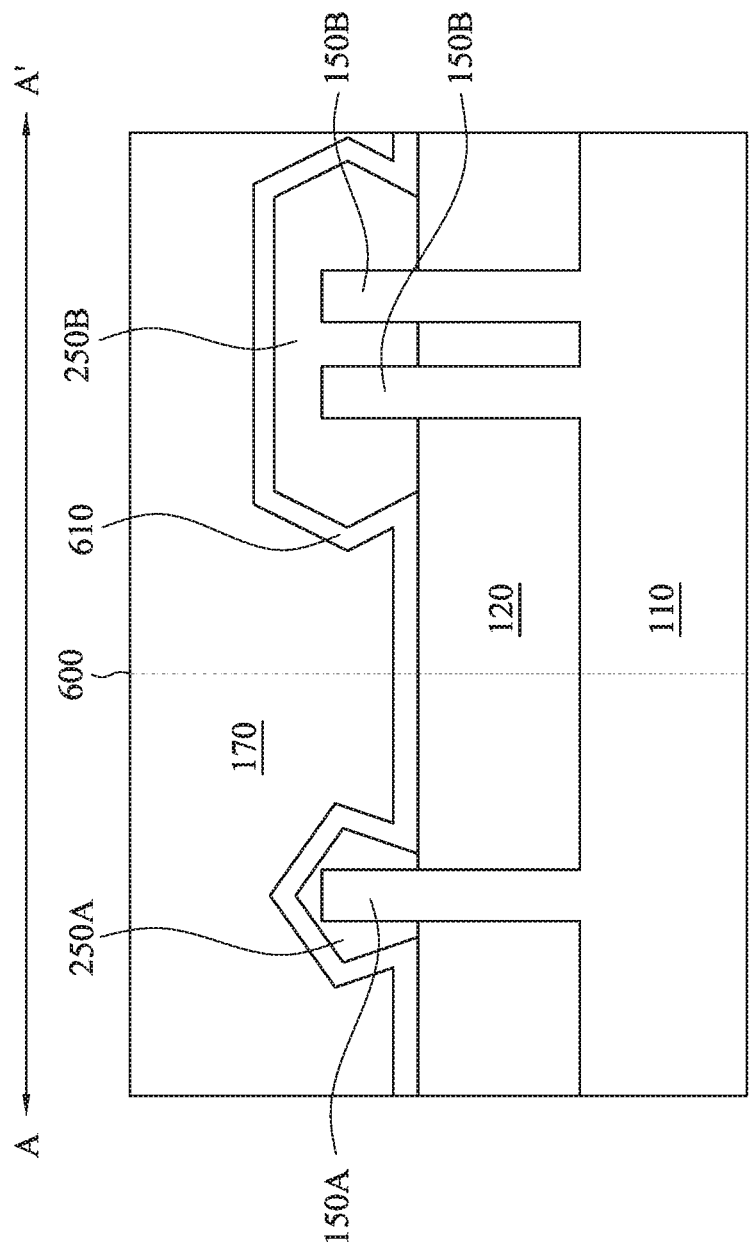

As discussed above with reference to FIG. 2, the FinFET device 100 may include a FinFET device 100A and a FinFET device 100B, which may be different types of devices. For example, the FinFET device 100A may be a PFET, and the FinFET 100B may be an NFET. A boundary 600 exists between the PFET 100A and the NFET 100B, as shown in FIGS. 13A-13B and 13D. In some embodiments, the NFET 100B is larger than the PFET 100A, for example the NFET 100B may have a greater dimension in the Y-direction, as shown in the top view of FIG. 13D.

As discussed above with reference to FIG. 2, the PFET device 100A includes a plurality of fin structures 150A, and the NFET device 100B includes a plurality of fin structures 150B. Gate structures 200 are also formed in both the PFET device 100A and the NFET device 100B. At this stage of fabrication, the gate structures 200 are continuous and have not been "cut" yet. As shown in the top view of FIG. 13D, the fin structures 150A and 150B each extend in the X-direction, while the gate structures 200 each extend in the Y-direction.

Source/drain regions 250A and 250B are also formed in the PFET devices 100A and NFET devices 100B, respectively. For example, the source/drain region 250A may be the source/drain region of the PFET 100A, and the source/drain region 250B may be the source/drain region of the NFET 100B. In the top view of FIG. 13D, the boundaries of the source/drain regions 250A and 250B are illustrated as dashed/broken lines. However, it is understood that the top view geometric profile of the source/drain regions 250A and 250B may not necessarily resemble the rectangles shown in FIG. 13D. For example, the top view geometric profiles of the source/drain regions 250A and 250B may be curved/rounded (e.g., resembling an ellipse or an oval), or it may exhibit a somewhat irregular top view profile.

Figure 13C:
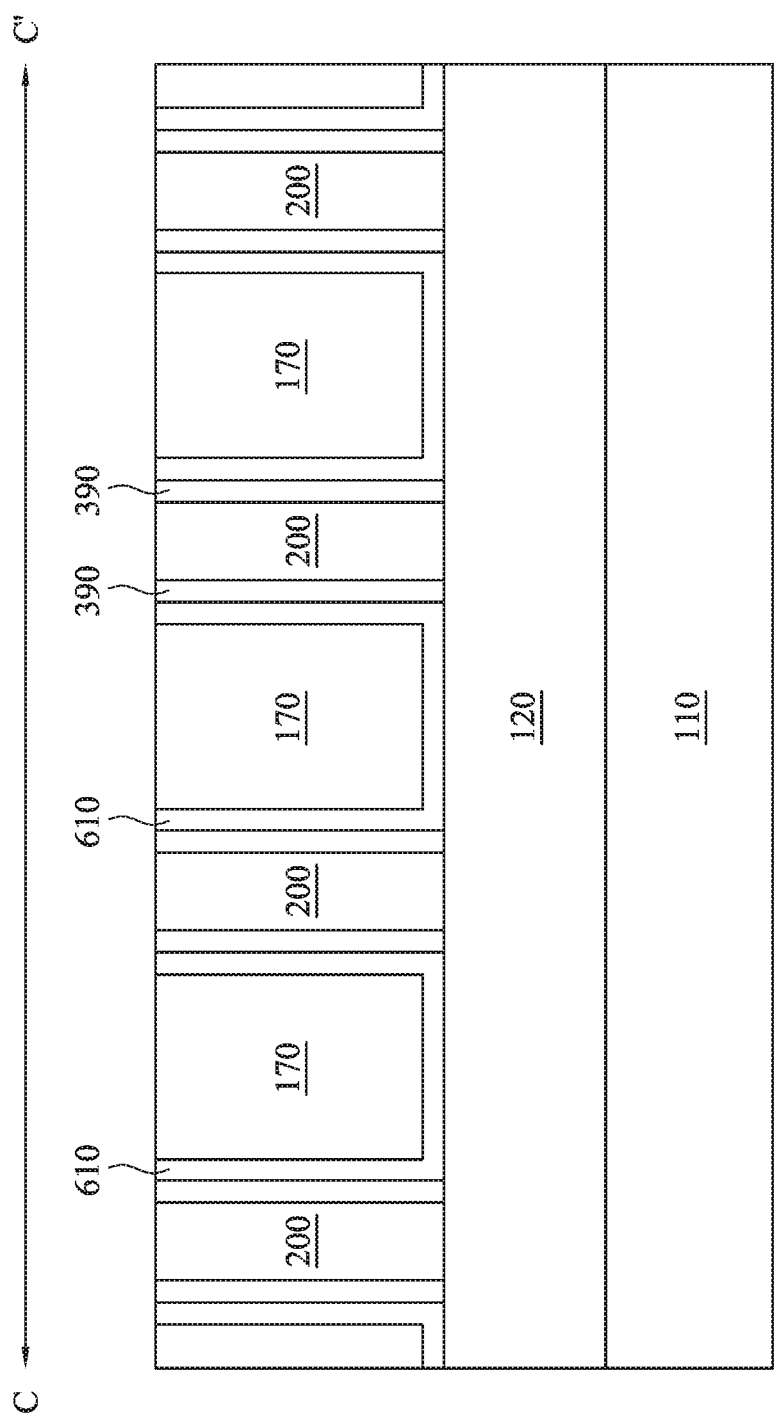
Figure 13D:
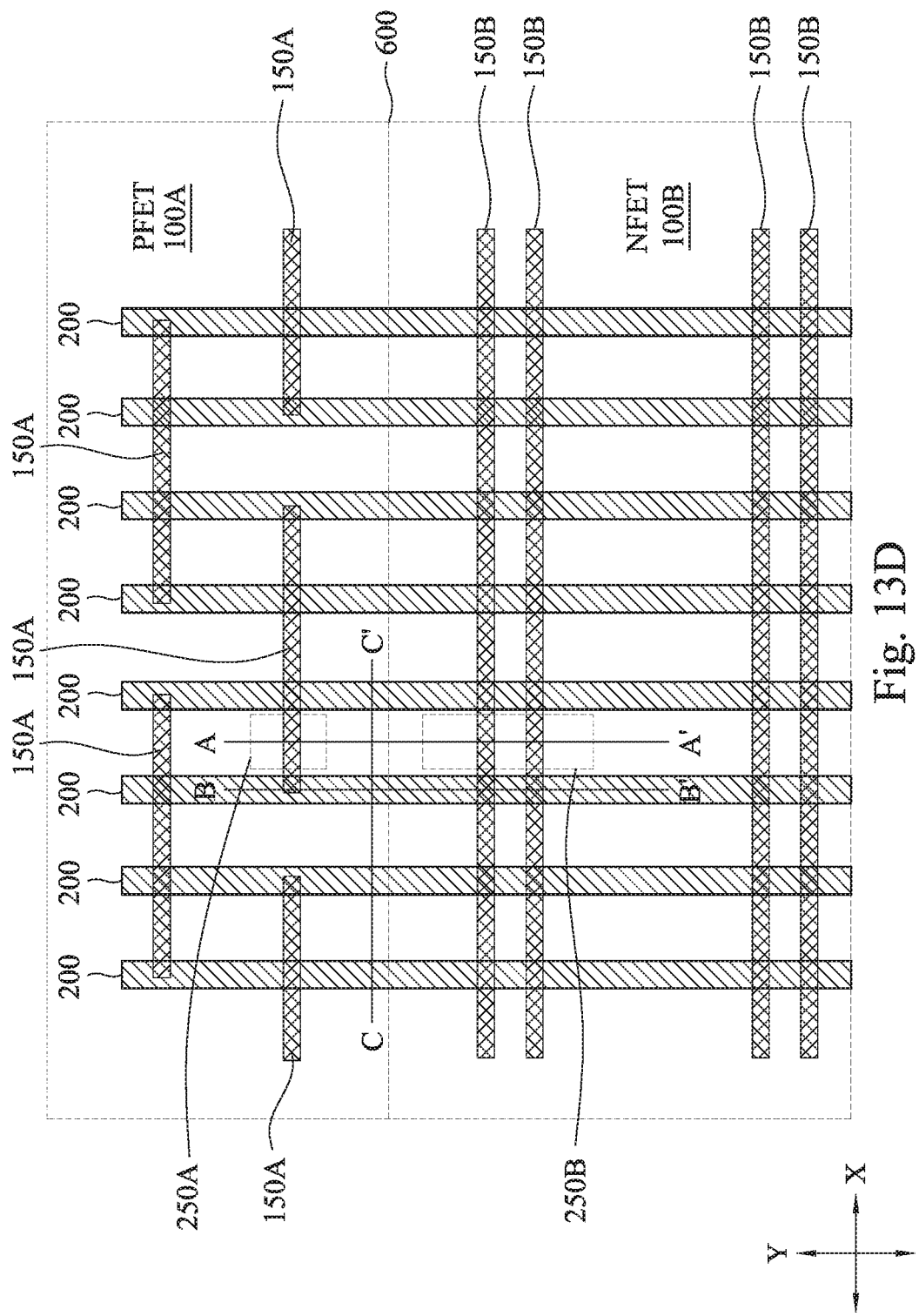

The cross-sectional side views of FIGS. 13A, 13B, and 13C are obtained by taking a cross-section of the FinFET device 100 from points A-A', B-B', and C-C' on FIG. 13D, respectively. In more detail, FIG. 13A illustrates a cross-section that spans partially over both the PFET 100A and the NFET 100B along the Y-direction, as does FIG. 13B.

However, the location of points A-A' are between two adjacent gate structures 200, and as such, the FIG. 13A illustrates the cross-sectional side views of source/drain regions 250A (for the PFET 100A) and source/drain regions 250B (for the NFET 100B). In comparison, the location of the points B-B' are on one of the gate structures 200, and as such, the FIG. 13B illustrates the cross-sectional side view of a portion of one of the gate structures 200 (that spans across the boundary 600 between the PFET 100A and the NFET 100B). Meanwhile, FIG. 13C illustrates a cross-section taken in the PFET 100A and across several of the gate structures 200.

As shown in FIG. 13A, the fin structures 150A and 150B are formed to protrude vertically upwards from the substrate 110 in the PFET 100A and the NFET 100B, respectively. The source/drain regions 250A and 250B for the PFET 100A and the NFET 100B are then epitaxially grown on the fin structures 150A and 150B, respectively. As discussed above, the source/drain region 250B for the NFET 100B is substantially larger than the source/drain region 250A for the PFET 100A and as such may be more prone to inadvertent etching, which is an issue the present disclosure addresses by forming the isolation structure 300 closer to the PFET 100A (discussed above with reference to FIGS. 12A-12C and further below). A layer 610 is formed over the source/drain regions 250A and 250B. In some embodiments, the layer 610 contains a dielectric material and may serve as an etching-stop layer. The ILD 170 (discussed above with reference to FIG. 3) is formed over the source/drain regions 250A-250B and over the layer 610.

In FIG. 13B, the fin structures 150A-150B and the gate structure 200 are visible, but the source/drain regions 250A-250B, the layer 610, and the ILD 170 are not. As shown in FIG. 13B, the gate structure 200 partially wraps around each of the fin structures 150A and 150B, for example around the upper surface and a portion of the side surfaces of each of the fin structures 150A and 150B.

FIG. 13C shows the gate structures 200 located over the isolation structure 120. The spacers 390 (discussed above with reference to FIGS. 5A-5C) are formed on both of the sidewalls of each of the gate structures 200. The layer 610 is located between the ILD 170 and the spacers 390.

Figure 14A:
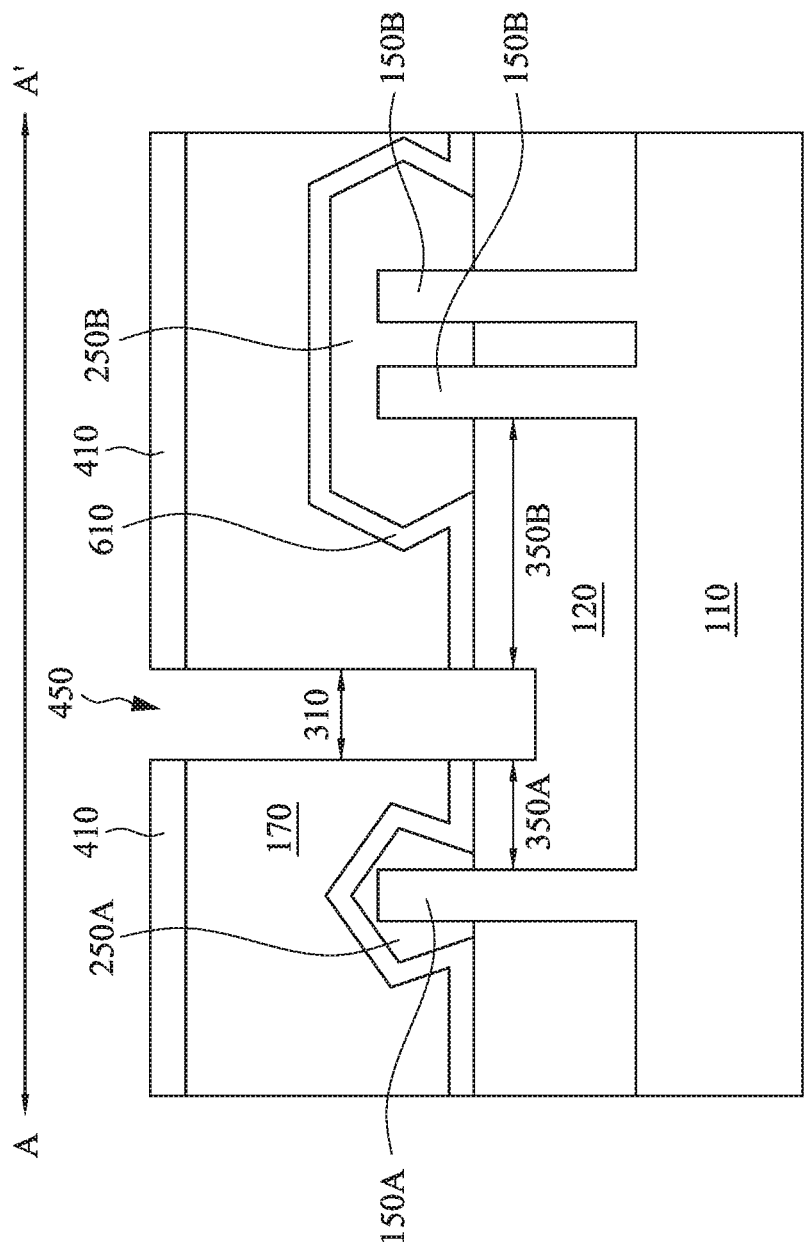
Figure 14B:
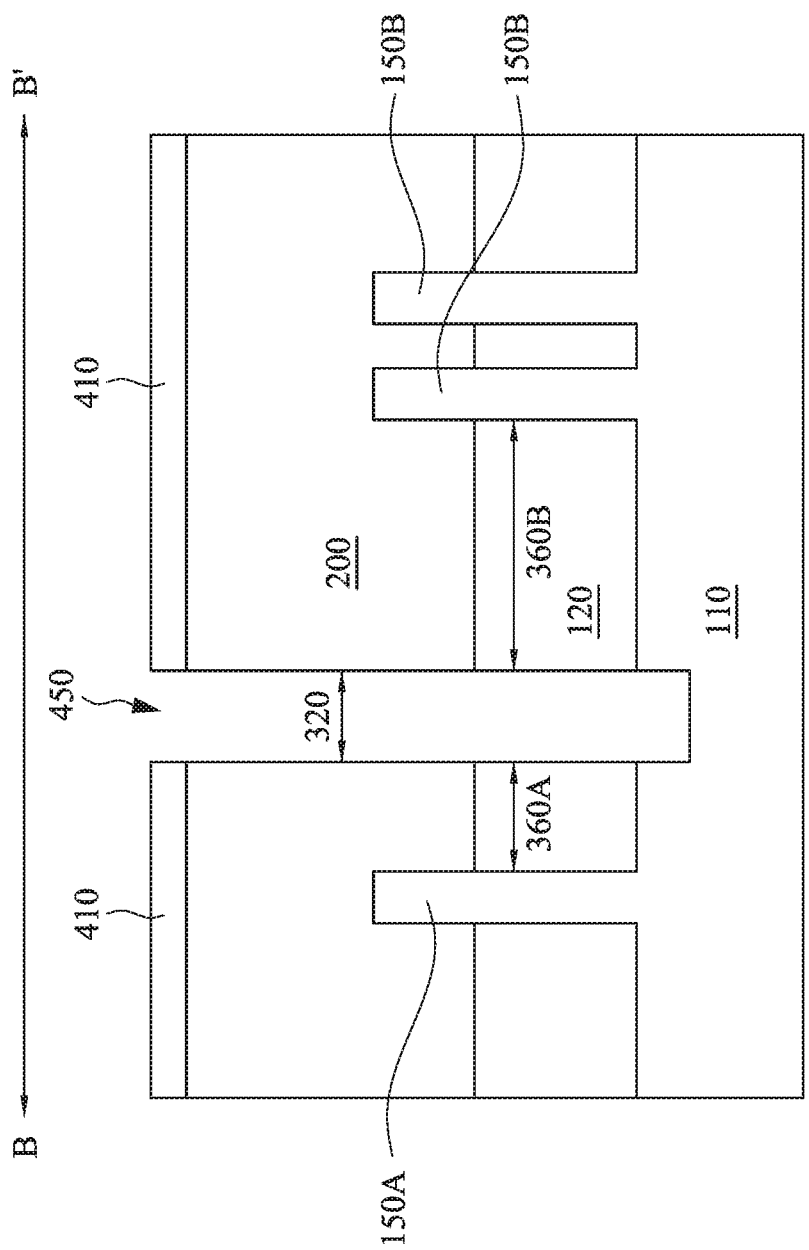
Figure 14C:
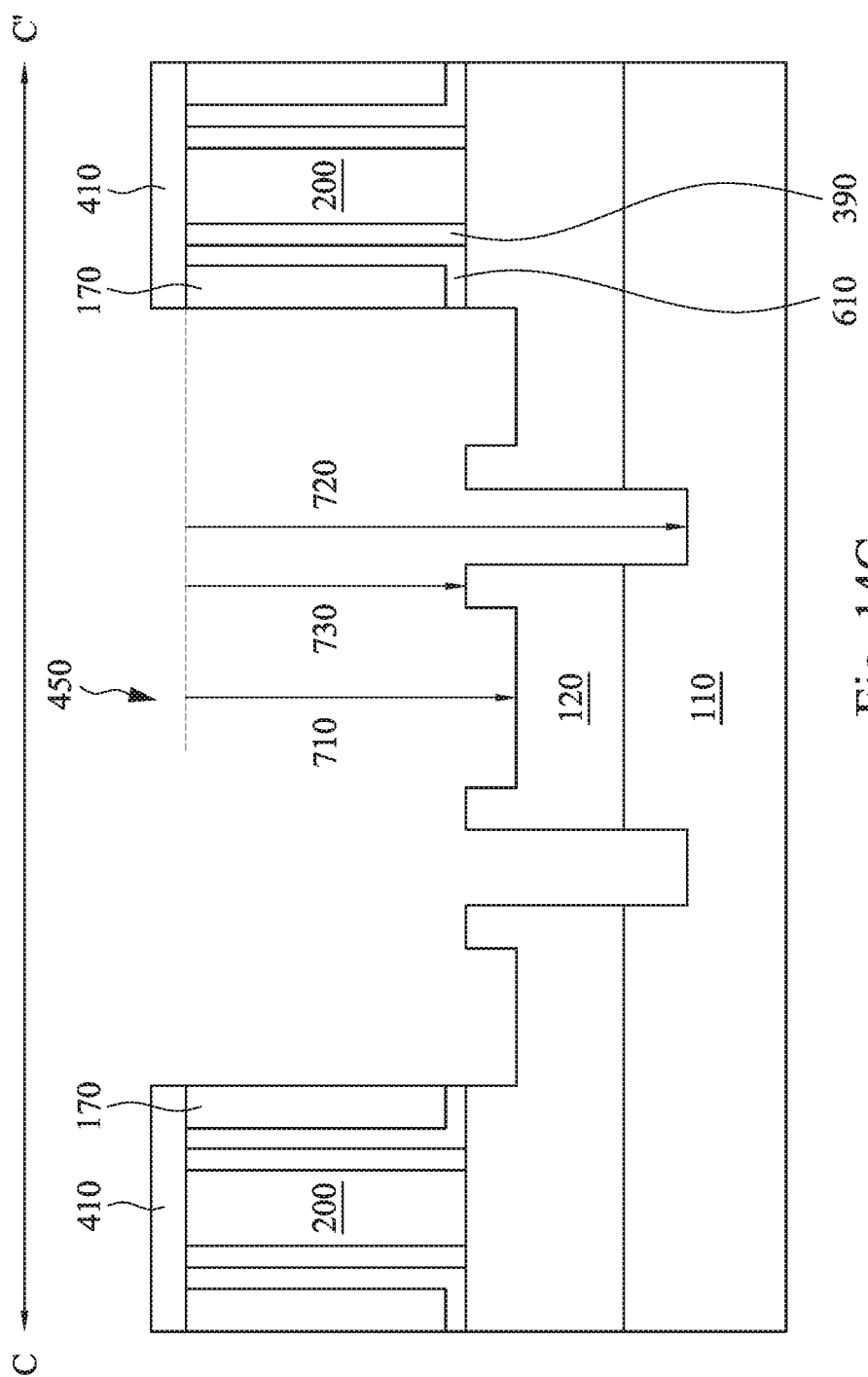
Figure 14D:
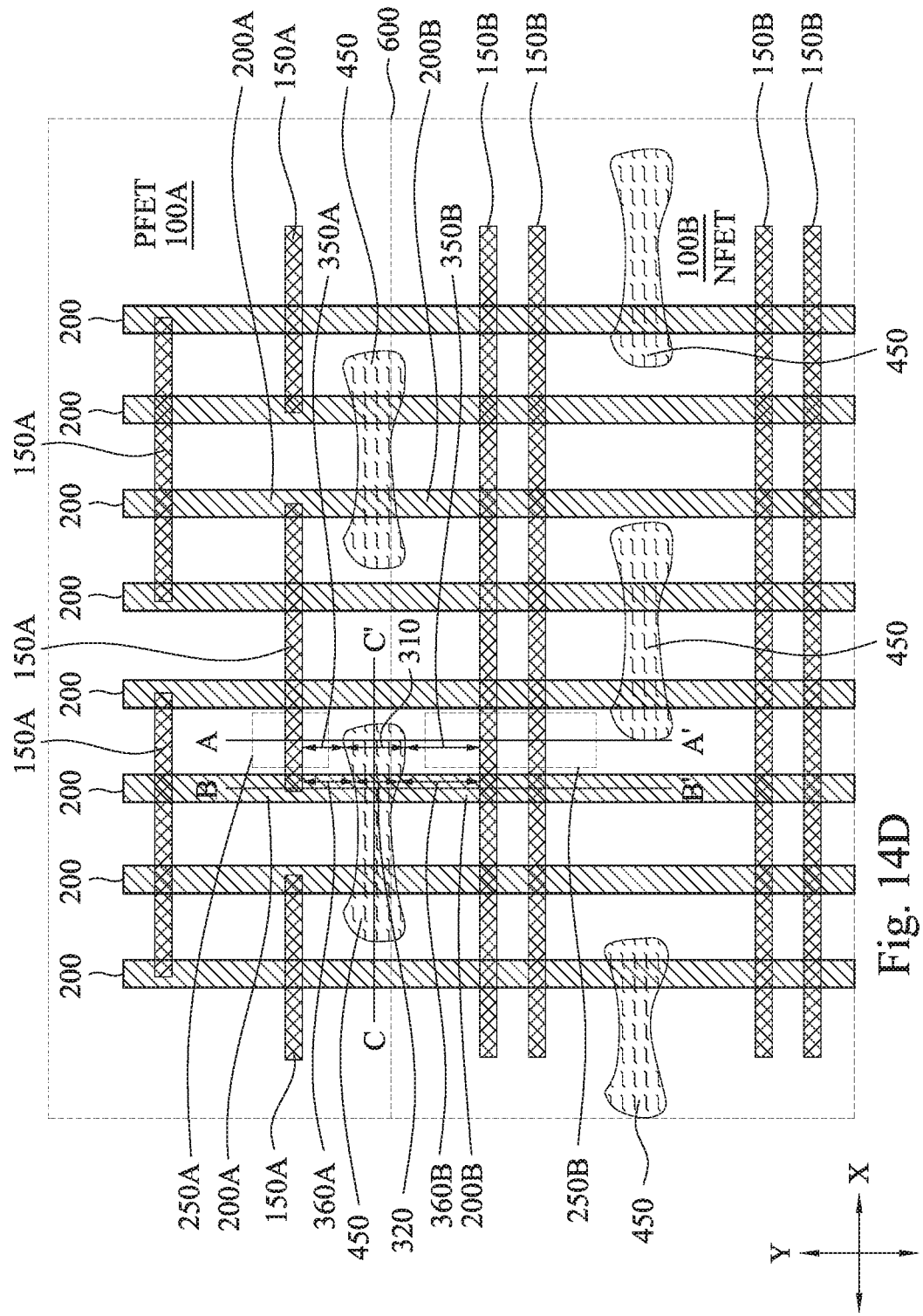
Figure 15A:
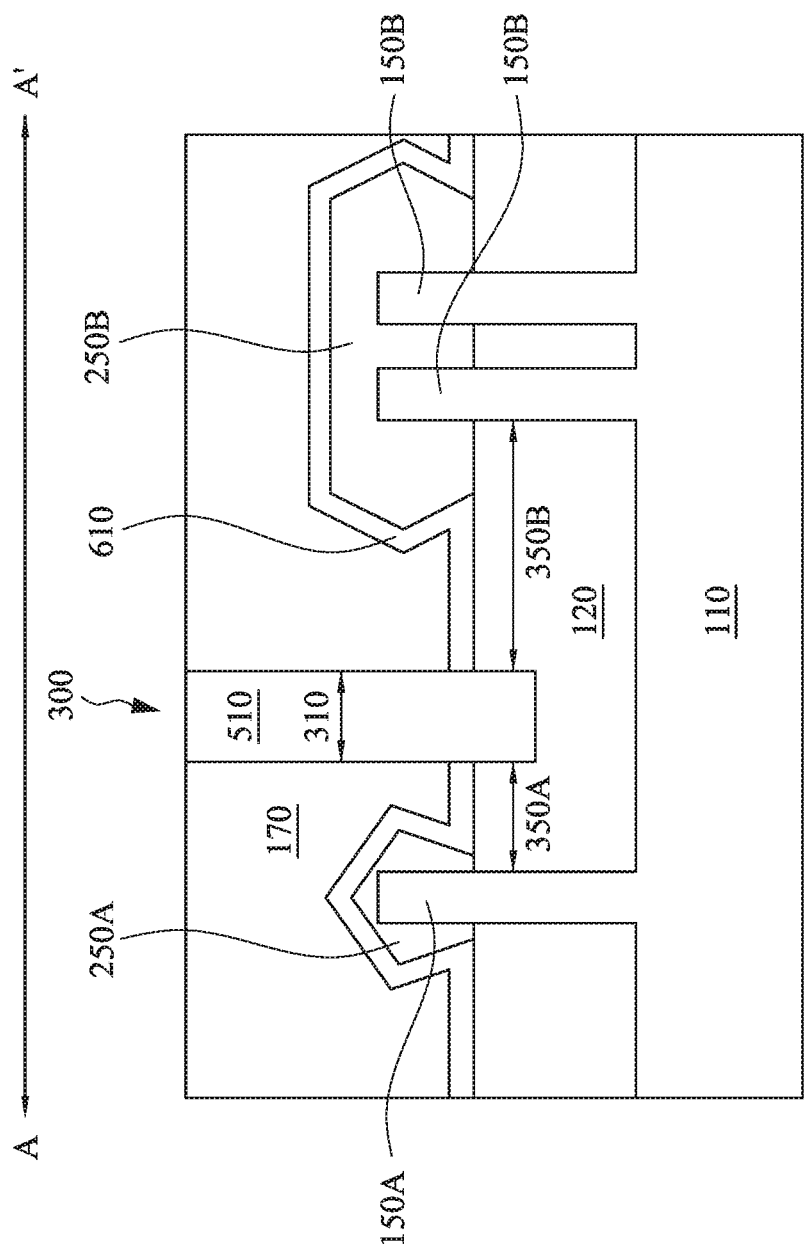
Figure 15D:
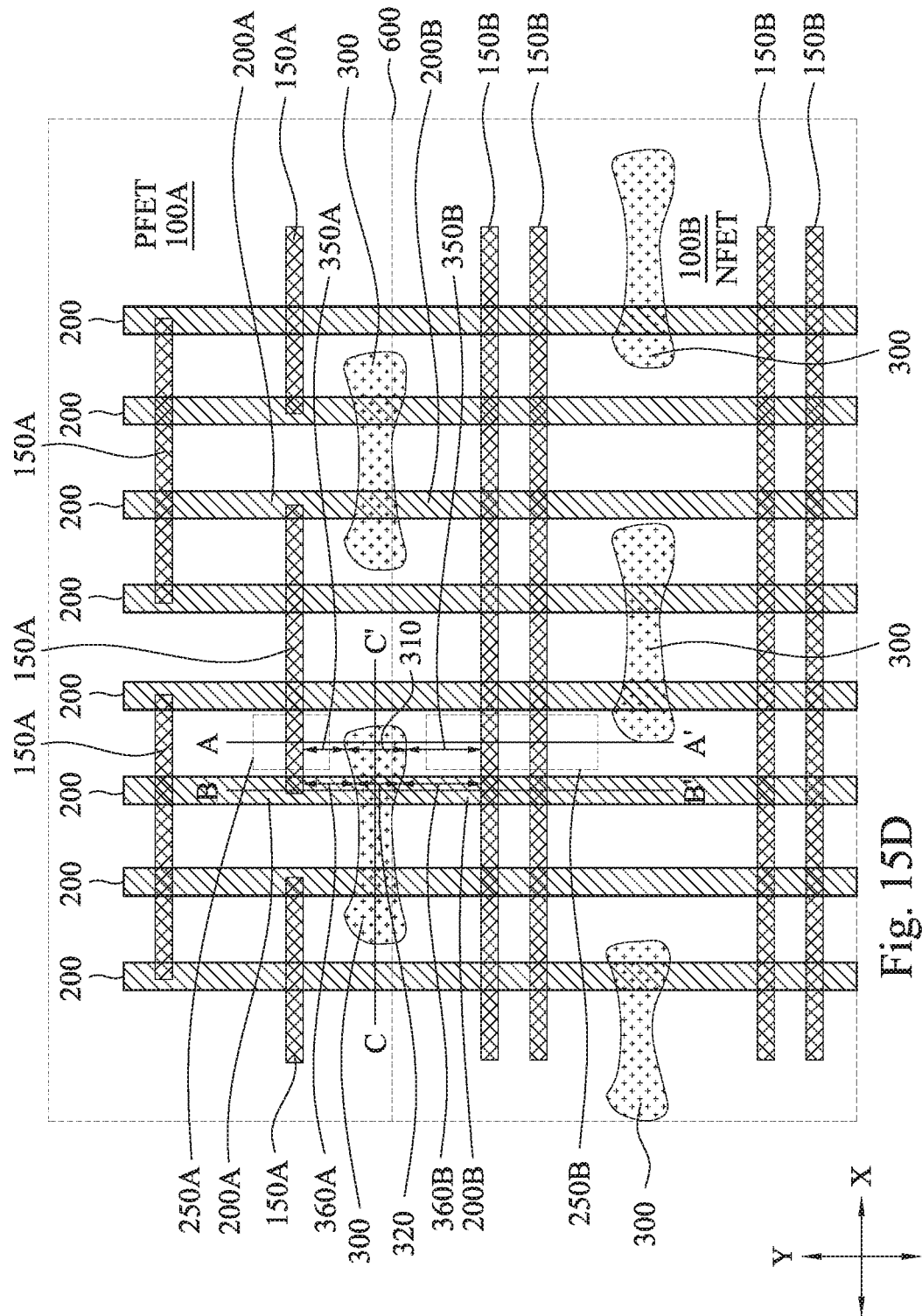

Referring now to FIGS. 14A-14D, openings 450 (e.g., discussed above in association with FIGS. 10A-10C) are formed. The openings 450 may also be referred to as cut-metal-gate (CMG) openings or CMG trenches. As shown in the cross-sectional side views of FIGS. 14A-14C, the CMG openings 450 may be defined by the hardmask layer 410 (also discussed above in association with FIGS. 10A-10C) and may extend vertically downward through the ILD 170 and through the gate structures 200. As shown in the top view of FIG. 14D, the CMG openings 450 each span horizontally through one or more gate structures 200, and as such they "cut open" the gate structures 200. The "cut" gate structure 200 is divided or separated into adjacent gate structures 200A and 200B, as shown in FIG. 14D.

As discussed above, the CMG openings 450 are formed to be closer to the FinFET device that has the smaller source/drain region, so as to prevent inadvertent etching of the source/drain region. Alternatively, the CMG opening 450 may be formed to be closer to the FinFET device that has the stronger etching resistance, so that any inadvertent etching to the source/drain region will not cause significant damage to the source/drain region. In the embodiment shown in FIGS. 14A-14D, the CMG openings 450 are formed to be closer to the PFET 100A than to the NFET 100B, due to the smaller volume of the source/drain region 250A and/or the stronger etching resistance of the source/drain region 250A (compared to the source/drain region 250B). This is demonstrated in FIGS. 14A, 14B, and 14D, as the distance 350A is significantly smaller than the distance 350B, and the distance 360A is significantly smaller than the distance 360B.

As discussed above in association with FIGS. 2-4, the distance 350A and the distance 360A are the distances between the CMG opening 450 and the nearest fin structure 150A of the PFET 100A, and the distances 350B and 360B are the distances between the CMG opening 450 and the nearest fin structure 150B of the NFET 100B. The distances 350A-350B are measured from locations of the CMG opening 450 not overlying the gate structure 200, whereas the distances 360A-360B are measured from locations of the CMG opening 450 overlying the gate structure 200.

One reason that the distances 350A and 360B are not the same (or that the distances 350B and 360B are not the same) is because the CMG opening 450 is not a perfect rectangle. For example, as shown in FIG. 14D, the CMG opening 450 may have a top view profile similar to a dumbbell (or a bone), such that its end portions protrude laterally outwards more than its middle portion. Since the portion of the CMG opening 450 is "fatter" where the distance 350A is measured, the distance 350A is smaller than the distance 360A. The dumbbell-like shape of the CMG opening 450 is also illustrated by the fact that the dimension 310 is greater than the dimension 320 (shown in FIGS. 14A-14B and 14D). As discussed above in association with FIGS. 2-4, the dimension 310 is the dimension of the CMG opening 450 at its end portion (not overlapping with the gate structure 200), and the dimension 320 is the dimension of the CMG opening 450 closer to its middle (overlapping with the gate structure 200), where both the dimensions 310 and 320 are measured in the Y-direction.

It is understood that the top view profile of the CMG opening 450 may be correlated to the etching recipe used to form the CMG opening 450. In some alternative embodiments, the top view profile of the CMG opening 450 may resemble an ellipse, such that the dimension 310 may be smaller than the dimension 320, and that the distance 350A may be greater than the distance 360A.

The CMG opening 450 may be formed to have varying depths at different locations. For example, as shown in FIG. 14C, the CMG opening 450 may have a depth 710, a depth 720, and a depth 730 that are different from one another. The depth 710 may correspond to a location of the ILD 170, the depth 720 may correspond to a location where the etched-away gate structure 200 used to be (before the etching process was performed to form the CMG opening 200), and the depth 730 may correspond to a location of the spacers (e.g., the spacers 390) and the etching-stop layer (e.g., the layer 610) that are also etched away along with the gate structure 200.

As a result of the different material compositions of the ILD 170, the gate structure 200, and the spacers 190 (and/or the etching-stop layer 610), they may have different etching rates with respect to the etching process used to form the CMG opening 450. Since the etching process is tuned to "cut open" the gate structure 200, the gate structure 200 may have a higher etching rate than the other materials. Consequently, the depth 720 corresponding to the location of the gate structure 200 may be the greatest (deepest) among the depths 710, 720, and 730. The etching rates of the ILD 170 and the spacers 390 (and/or the etching-stop layer 610) are less than that of the gate structure 200, and thus the depths 710 and 730 are less than the depth 720. However, depending on the loading, the etching rate of the spacers 390 (and/or the etching-stop layer 610) may be greater than, or less than, the etching rate of the ILD 170. As such, in some embodiments (such as the illustrated embodiment), the depth 730 may be less than the depth 710, while in other embodiments, the depth 730 may be greater than the depth 710.

It is also understood that the CMG openings 450 do not need to have the same horizontal and/or lateral dimensions as one another. In some embodiments, for IC design purposes, some of the gate structures may be configured to have a larger gate length Lg (discussed above in association with FIG. 1, where the Lg is measured in the X-direction) than the rest of the gate structures 200. The gate structure 200 having the larger gate length is more difficult to cut/etch, and thus the corresponding CMG opening 450 for that gate structure is configured to have larger lateral dimensions (i.e., in the X-direction and the Y-direction), so as to make it easier to etch the gate structure 200 with the larger gate length. As such, the CMG openings 450 may have different dimensions 310 (or 320) from one another. In addition, the different lateral dimensions for the CMG openings 450 may result in different etching depths too, for example a CMG opening with the larger lateral dimensions may lead to a deeper etching depth. Consequently, the CMG openings 450 corresponding to the larger gate length may also have the deeper depths 710, 720, or 730.

Referring now to FIGS. 15A-15D, the dielectric layer 510 is formed to fill the CMG openings 450, followed by a planarization process (e.g. a CMP process). As a result, the isolation structures 300 are formed. The isolation structures 300 provide electrical isolation between adjacent gate structures 200A and 200B, and thus the isolation structures 300 may be referred to as cut-metal-gate (CMG) structures. As discussed above, the isolation structure 300 may include a single material or a multi-stack material. The overall dielectric constant of the isolation structure 300 may be customized to optimize its functionality (e.g., providing electrical isolation). In some embodiments, the isolation structure 300 may also have a seam or void, such as the seam 530 discussed above in association with FIGS. 12B-12C.

Figure 16:
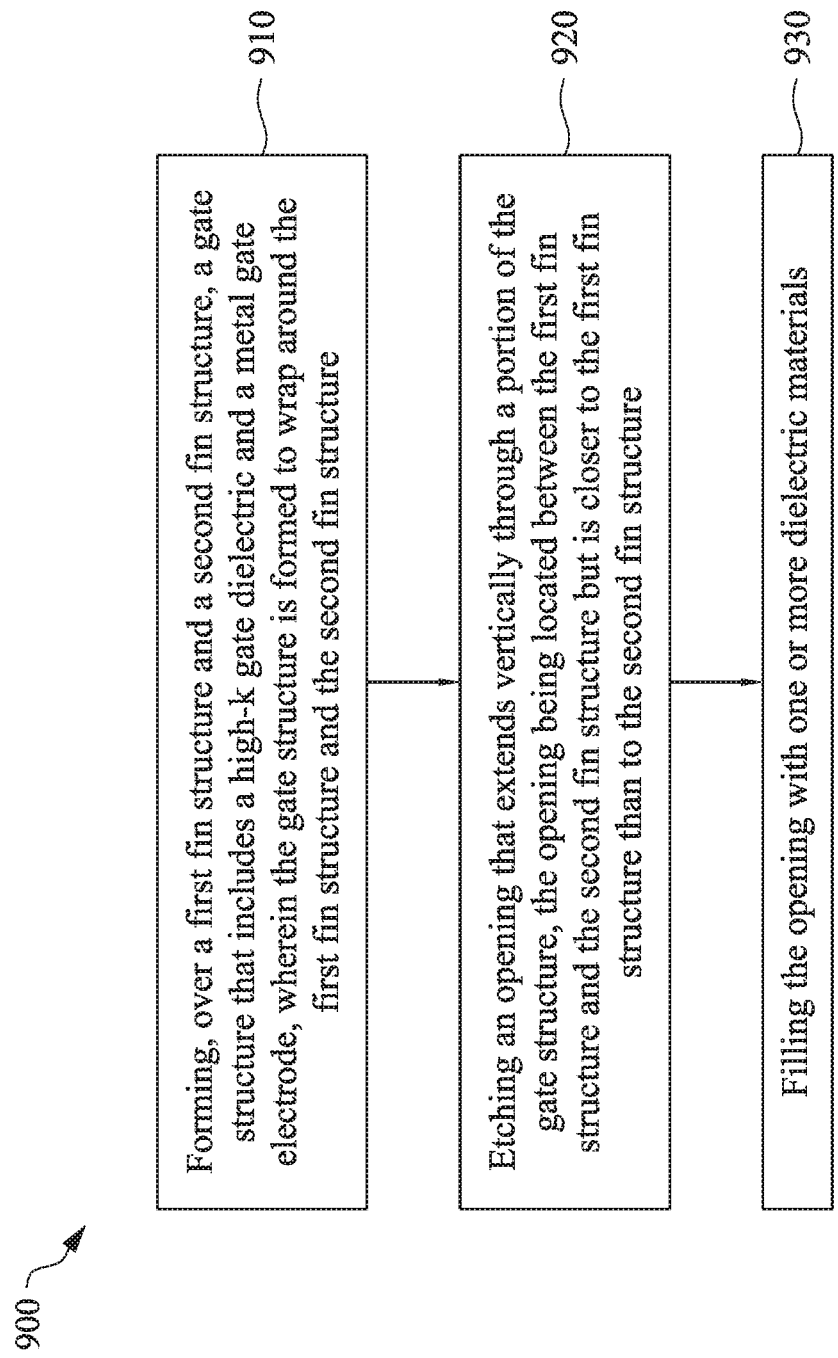
FIG. 16 is a flow chart of a method for fabricating a FinFET device in accordance with embodiments of the present disclosure.

FIG. 16 is a flowchart of a method 900 for fabricating a FinFET device in accordance with various aspects of the present disclosure. The method 900 includes a step 910 of forming, over a first fin structure and a second fin structure, a gate structure that includes a high-k gate dielectric and a metal gate electrode. The gate structure is formed to wrap around the first fin structure and the second fin structure.

The method 900 includes a step 920 of etching an opening that extends vertically through a portion of the gate structure. The opening is located between the first fin structure and the second fin structure but is closer to the first fin structure than to the second fin structure.

The method 900 includes a step 930 of filling the opening with one or more dielectric materials. In some embodiments, the filling the opening comprises: substantially filling the opening with a first layer using an atomic layer deposition process, forming a second layer over the first layer using a chemical vapor deposition process, and polishing the second layer and the first layer. In some embodiments, the filling the opening is performed such that an air gap is trapped inside a portion of the first layer filling the opening.

It is understood that additional process steps may be performed before, during, or after the steps 910-930 discussed above to complete the fabrication of the semiconductor device. For example, the method 900 includes a step of before the forming of the gate structure, epitaxially growing a first source/drain structure on the first fin structure and epitaxially growing a second source/drain structure on the second fin structure. The first source/drain structure is grown to have a smaller size than the second source/drain structure or is more resistant to the etching than the second source/drain structure. Other steps may be performed but are not discussed herein in detail for reasons of simplicity.

Based on the above discussions, it can be seen that the present disclosure offers advantages over conventional FinFET devices and the fabrication thereof. It is understood, however, that other embodiments may offer additional advantages, and not all advantages are necessarily disclosed herein, and that no particular advantage is required for all embodiments. One advantage is that by forming the isolation structure (e.g., the isolation structure 300 discussed above) to be closer to the FinFET device with the smaller source/drain region, the present disclosure can reduce the risk of the source/drain regions being inadvertently and undesirably etched during the formation of the isolation structure. Another advantage is that by forming the isolation structure (e.g., the isolation structure 300 discussed above) to be closer to the FinFET device with the stronger etching resistance, the present disclosure can reduce the potential damage caused by the inadvertent etching. For example, even if the source/drain region (with the stronger etching resistance) is somehow inadvertently exposed to the etching chemicals (e.g., etching gases) used in forming the isolation structure, the stronger etching resistance of the source/drain region means that less damage will occur. Other advantages include compatibility with existing fabrication process flows, etc.

One aspect of the present disclosure involves a semiconductor device. A first FinFET device includes a plurality of first fin structures that each extend in a first direction in a top view. A second FinFET device includes a plurality of second fin structures that each extend in the first direction in the top view. The first FinFET device and the second FinFET device are different types of FinFET devices. A plurality of gate structures each extends in a second direction in the top view. The second direction being different from the first direction. Each of the gate structures partially wraps around the first fin structures and the second fin structures. A dielectric structure is disposed between the first FinFET device and the second FinFET device, wherein the dielectric structure cuts each of the gate structures into a first segment for the first FinFET device and a second segment for the second FinFET device. The dielectric structure is located closer to the first FinFET device than to the second FinFET device.

One aspect of the present disclosure involves a semiconductor device. A first fin protrudes upwardly out of a dielectric material. The first fin extends in a first direction in a top view. A first gate partially wraps around the first fin. The first gate extends in a second direction perpendicular to the first direction in the top view. A second fin protrudes upwardly out of the dielectric material. The second fin extends in the first direction in the top view. A second gate partially wraps around the second fin. The second gate extends in the second direction. An isolation structure is located over the dielectric material and between the first fin and the second fin. The isolation structure extends in the first direction in the top view. A first sidewall of the isolation structure borders a first sidewall of the first gate. A second sidewall of the isolation structure borders a second sidewall of the second gate. A first spacing exists between the first fin and the first sidewall of the isolation structure. A second spacing exists between the second fin and the second sidewall of the isolation structure. The first spacing is not equal to the second spacing.

Another aspect of the present disclosure involves a method of fabricating a semiconductor device. A gate structure is formed over a first fin structure and a second fin structure. The gate structure includes a high-k gate dielectric and a metal gate electrode. The gate structure is formed to wrap around the first fin structure and the second fin structure. An opening that is etched extends vertically through a portion of the gate structure. The opening is located between the first fin structure and the second fin structure but is closer to the first fin structure than to the second fin structure. The opening is filled with one or more dielectric materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first FinFET device that includes a plurality of first fin structures that each extend in a first direction in a top view;
a second FinFET device that includes a plurality of second fin structures that each extend in the first direction in the top view, wherein the first FinFET device and the second FinFET device are different types of FinFET devices;
a first epitaxial structure grown on each of the first fin structures;
a second epitaxial structure grown on each of the second fin structures, wherein the first epitaxial structure is smaller than the second epitaxial structure;
a plurality of gate structures that each extend in a second direction in the top view, the second direction being different from the first direction, wherein each of the gate structures partially wraps around the first fin structures and the second fin structures; and
a dielectric structure that is disposed between the first FinFET device and the second FinFET device, wherein the dielectric structure cuts each of the gate structures into a first segment for the first FinFET device and a second segment for the second FinFET device, and wherein the dielectric structure is located closer to the first FinFET device than to the second FinFET device.

2. The semiconductor device of claim 1, wherein:
one of the first FinFET device and the second FinFET device includes an NFET; and
another one of the first FinFET device and the second FinFET device includes a PFET.

3. The semiconductor device of claim 1, wherein:
the dielectric structure is spaced apart from the first FinFET device by a first distance;
the dielectric structure is spaced apart from the second FinFET device by a second distance; and
a difference between the second distance and the first distance is in a range between about 2 nanometers and about 30 nanometers.

4. The semiconductor device of claim 1, wherein the dielectric structure extends in the first direction in the top view.

5. The semiconductor device of claim 1, wherein the dielectric structure extends downwardly through at least some of the gate structures.

6. The semiconductor device of claim 1,
wherein the first epitaxial structure is more etching-resistant than the second epitaxial structure.

7. The semiconductor device of claim 1, further comprising: an air gap disposed in the dielectric structure.

8. A semiconductor device, comprising:
a first fin that protrudes upwardly out of a dielectric material, wherein the first fin extends in a first direction in a top view;
a first gate that partially wraps around the first fin, wherein the first gate extends in a second direction perpendicular to the first direction in the top view;
a second fin that protrudes upwardly out of the dielectric material, wherein the second fin extends in the first direction in the top view;
a second gate that partially wraps around the second fin, wherein the second gate extends in the second direction; and
an isolation structure located over the dielectric material and between the first fin and the second fin;
wherein:
the isolation structure extends in the first direction in the top view and contains a seam that is at least partially filled with air;
a first sidewall of the isolation structure borders a first sidewall of the first gate;
a second sidewall of the isolation structure borders a second sidewall of the second gate;
a first spacing exists between the first fin and the first sidewall of the isolation structure;
a second spacing exists between the second fin and the second sidewall of the isolation structure; and
the first spacing is not equal to the second spacing.

9. The semiconductor device of claim 8, wherein:
the first fin is a part of a first FinFET device; and
the second fin is a part of a second FinFET device that is a different type of device than the first FinFET device.

10. The semiconductor device of claim 9, wherein:
the first FinFET device is an NFET; and
the second FinFET device is a PFET.

11. The semiconductor device of claim 8, wherein a difference between the first spacing and the second spacing is greater than at least 2 nanometers.

12. The semiconductor device of claim 8, wherein the first spacing is smaller than the second spacing, and wherein the semiconductor device further comprises:
a first source/drain structure formed on the first fin; and
a second source/drain structure formed on the second fin.

13. The semiconductor device of claim 12, wherein:
the first source/drain structure is smaller than the second source/drain structure or is more resistant to etching than the second source/drain structure.

14. A method, comprising:
epitaxially growing a first source/drain structure on a first fin structure and epitaxially growing a second source/drain structure on a second fin structure;
forming, over the first fin structure and the second fin structure, a gate structure that includes a high-k gate dielectric and a metal gate electrode, wherein the gate structure is formed to wrap around the first fin structure and the second fin structure;
etching an opening that extends vertically through a portion of the gate structure, the opening being located between the first fin structure and the second fin structure but is closer to the first fin structure than to the second fin structure; and filling the opening with one or more dielectric materials.

15. The method of claim 14, wherein the first source/drain structure is grown to have a smaller size than the second source/drain structure or is more resistant to the etching than the second source/drain structure.

16. The method of claim 14, wherein the filling the opening comprises:
   substantially filling the opening with a first layer using an atomic layer deposition process;
   forming a second layer over the first layer using a chemical vapor deposition process; and
   polishing the second layer and the first layer.

17. The method of claim 16, wherein the filling the opening is performed such that an air gap is trapped inside a portion of the first layer filling the opening.

18. The semiconductor device of claim 1, wherein a lateral dimension of the second epitaxial structure is at least 25% greater than a lateral dimension of the first epitaxial structure.

19. The semiconductor device of claim 6, wherein the first epitaxial structure is more etching-resistant to $Cl_2$ or $CF_4$ than the second epitaxial structure.

20. The semiconductor device of claim 13, wherein:
   a lateral dimension of the second source/drain structure is at least 25% greater than a lateral dimension of the second source/drain structure; or
   the first source/drain structure is more resistant to $Cl_2$ or $CF_4$ than the second source/drain structure.

* * * * *